US012757679B2

(12) United States Patent
Waldfried et al.

(10) Patent No.: US 12,757,679 B2
(45) Date of Patent: Oct. 6, 2026

(54) ELECTROSTATIC CHUCK AND RELATED METHODS AND STRUCTURES

(71) Applicant: ENTEGRIS, INC., Billerica, MA (US)

(72) Inventors: Carlo Waldfried, Middleton, MA (US); Jakub Rybczynski, Arlington, MA (US); Florentina Popa, Houston, TX (US); Murat Yaldizli, Westford, MA (US)

(73) Assignee: Entegris, Inc., Billerica, MA (US)

( * ) Notice: Subject to any disclaimer, the term of this patent is extended or adjusted under 35 U.S.C. 154(b) by 964 days.

(21) Appl. No.: 17/944,904

(22) Filed: Sep. 14, 2022

(65) Prior Publication Data

US 2023/0084930 A1 Mar. 16, 2023

Related U.S. Application Data

(60) Provisional application No. 63/244,975, filed on Sep. 16, 2021.

(51) Int. Cl.
*H10P 72/72* (2026.01)

(52) U.S. Cl.
CPC .................................. *H10P 72/722* (2026.01)

(58) Field of Classification Search
CPC ........... H01L 21/67109; H01L 21/6833; Y02P 10/25; H10P 72/0432; H10P 72/0434; H10P 72/3306; H10P 72/70; H10P 72/722; H10P 72/7612
USPC ...................................................... 219/444.1
See application file for complete search history.

(56) References Cited

U.S. PATENT DOCUMENTS

| | | | |
|---|---|---|---|
| 6,108,189 | A | 8/2000 | Weldon |
| 9,202,729 | B2 | 12/2015 | Eibl |
| 9,613,839 | B2 | 4/2017 | Blake |
| 9,737,934 | B2 | 8/2017 | Lafarre |
| 10,384,265 | B2 | 8/2019 | Swaminathan |
| 10,607,874 | B2 | 3/2020 | Maehata |
| 10,722,947 | B2 | 7/2020 | Cullinan |
| 10,844,488 | B2 | 11/2020 | Sershen |
| 11,837,492 | B2 | 12/2023 | Liu |
| 2003/0047283 | A1 | 3/2003 | Parkhe |
| 2005/0045106 | A1 | 3/2005 | Boyd, Jr. |
| 2007/0077354 | A1 | 4/2007 | O'Brien |
| 2008/0035306 | A1 | 2/2008 | White |
| 2008/0178608 | A1 | 7/2008 | Tandou et al. |
| 2008/0203925 | A1 | 8/2008 | Tandou |
| 2009/0080136 | A1 | 3/2009 | Nagayama |
| 2009/0291500 | A1 | 11/2009 | Takada |
| 2010/0084117 | A1 | 4/2010 | Fish |
| 2010/0103584 | A1 | 4/2010 | Nam |
| 2011/0154843 | A1 | 6/2011 | Ko |
| 2013/0131248 | A1 | 5/2013 | Tanase |
| 2014/0154465 | A1 | 6/2014 | Sun |
| 2014/0177123 | A1 | 6/2014 | Thach |

(Continued)

FOREIGN PATENT DOCUMENTS

| | | | |
|---|---|---|---|
| CN | 202905683 | U | 4/2013 |
| CN | 107851592 | A | 3/2018 |

(Continued)

*Primary Examiner* — Sang Y Paik

(57) ABSTRACT

Described are electrostatic chucks that are useful to support a workpiece during a step of processing the workpiece, and electrostatic chuck base components prepared by an additive manufacturing technique.

19 Claims, 10 Drawing Sheets

(56) References Cited

U.S. PATENT DOCUMENTS

| | | | |
|---|---|---|---|
| 2014/0209245 A1 | 7/2014 | Yamamoto | |
| 2014/0238609 A1* | 8/2014 | Tomioka | H01L 21/6875 279/128 |
| 2015/0348813 A1 | 12/2015 | Mangalore | |
| 2016/0352260 A1 | 12/2016 | Comendant | |
| 2017/0133244 A1 | 5/2017 | Knyazik et al. | |
| 2017/0140956 A1 | 5/2017 | Mclaughlin | |
| 2017/0243726 A1 | 8/2017 | Kellogg | |
| 2018/0216229 A1 | 8/2018 | Sershen | |
| 2018/0308737 A1 | 10/2018 | Moriya | |
| 2019/0035609 A1 | 1/2019 | Tobe | |
| 2019/0135705 A1 | 5/2019 | Yasui et al. | |
| 2020/0082087 A1 | 3/2020 | Simmons | |
| 2020/0176230 A1 | 6/2020 | Lu | |
| 2020/0194231 A1 | 6/2020 | Chen | |
| 2020/0251315 A1* | 8/2020 | Saito | H01L 21/67248 |
| 2020/0286755 A1* | 9/2020 | Ito | H01L 21/67109 |
| 2020/0365374 A1 | 11/2020 | Narendrnath | |
| 2021/0043476 A1 | 2/2021 | Koizumi | |
| 2022/0072649 A1* | 3/2022 | Svensson | B23K 15/0033 |
| 2022/0139681 A1 | 5/2022 | Erickson | |
| 2023/0033494 A1* | 2/2023 | Eliaz | B33Y 70/00 |

FOREIGN PATENT DOCUMENTS

| | | | |
|---|---|---|---|
| CN | 108346611 | A | 7/2018 |
| CN | 108995219 | A | 12/2018 |
| CN | 109300763 | A | 2/2019 |
| CN | 111095499 | A | 5/2020 |
| CN | 111276382 | A | 6/2020 |
| CN | 217239427 | U | 8/2022 |
| CN | 219106112 | U | 5/2023 |
| JP | 2014082476 | A | 5/2014 |
| JP | 2014150104 | A | 8/2014 |
| JP | 2019029373 | A | 2/2019 |
| JP | 2019081357 | A | 5/2019 |
| JP | 2019084823 | A | 6/2019 |
| JP | 2019212775 | A | 12/2019 |
| JP | 2020126900 | A | 8/2020 |
| JP | 2024535280 | A | 9/2024 |
| KR | 20060063182 | A | 6/2006 |
| KR | 20130131041 | A | 12/2013 |
| KR | 20140030450 | A | 3/2014 |
| KR | 20140108141 | A | 9/2014 |
| KR | 20170135742 | A | 12/2017 |
| KR | 20190076470 | A | 7/2019 |
| KR | 20200029655 | A | 3/2020 |
| KR | 20200067630 | A | 6/2020 |
| KR | 20200116161 | A | 10/2020 |
| KR | 20240056593 | A | 4/2024 |
| TW | 200634972 | A | 10/2006 |
| TW | 201027661 | A | 7/2010 |
| TW | 201931505 | A | 8/2019 |
| TW | 202333285 | A | 8/2023 |
| WO | 1999029001 | A2 | 6/1999 |
| WO | 2019164761 | A1 | 8/2019 |
| WO | 2020185467 | A1 | 9/2020 |
| WO | 2020219304 | A1 | 10/2020 |
| WO | 2023043835 | A1 | 3/2023 |

* cited by examiner

ELECTROSTATIC CHUCK AND RELATED METHODS AND STRUCTURES

CROSS-REFERENCE TO RELATED APPLICATIONS

This application claims the benefit under 35 USC 119 of U.S. Provisional Patent Application No. 63/244,975, filed Sep. 16, 2021, the disclosure of which is hereby incorporated herein by reference in its entirety.

FIELD

The disclosure relates to the field of a base component of an electrostatic chuck that is useful to support a workpiece during a step of processing the workpiece, with the base component ("base") being prepared to include flow channels having improved effectiveness when cooling a supported workpiece.

BACKGROUND

Electrostatic chucks (also referred to simply as "chucks," for short) are used in semiconductor and microelectronic device processing. A chuck holds in place a workpiece such as a semiconductor wafer or microelectronic device substrate to perform a process on a surface of the workpiece. The electrostatic chuck supports and secures the workpiece at an upper surface of the chuck by creating an electrostatic attractive force between the workpiece and the chuck. A voltage is applied to electrodes that are contained within the chuck to induce charges of opposite polarities in the workpiece and the chuck, creating an electrostatic attraction between the workpiece and the chuck.

The chuck includes various structures, devices, and designs that allow the chuck to perform or that improve performance. Typical electrostatic chuck assemblies are multi-component structures that include: a flat upper surface that supports a workpiece; electrical components such as electrodes, a conductive coating, and ground connections to control electrostatic charges of the chuck and a supported workpiece; one or more cooling systems to control a temperature of the chuck, a supported workpiece, or both; various other components that may include measurement probes, sensors, and moveable pins that are adapted to support or to change a position of a workpiece relative to the chuck; and cooling and electrical connections to connect the chuck to a tool interface.

A typical feature of an electrostatic chuck is a base that contains a cooling system made of a pattern of internal channels or passages formed in the body of the chuck. The channels are used to pass a flow of cooling fluid (e.g., gas, water, or another liquid) through the interior of the chuck to remove heat from the chuck and to control a temperature of the chuck and a workpiece supported by the chuck. Processing the workpiece can cause an increase in the temperature of the chuck. Passing the cooling fluid through the chuck removes heat from the chuck and controls the temperature of the workpiece. The placement and distribution of the channels within the base will affect the location and uniformity of heat removal from the base and from a supported substrate.

Desirably, to the largest extent possible, a base may be designed to provide uniform cooling effects over the area of the base. But materials that have been previously used to form a base structure (e.g., hard metals and ceramic materials), and current techniques that can be used to form the base from current base materials, limit the design of the cooling channels.

A base of an electrostatic chuck assembly must be made of a high hardness, high strength, solid material that can be processed to form a structure having highly precise features such as dimensions, flatness, surface roughness, cooling channels, and apertures. Current materials that are used for manufacturing bases of electrostatic chucks include aluminum and other metals or ceramics that can be formed into a precision base structure by machining techniques. Other than alumina, these materials can exhibit high hardness properties, which make them difficult and expensive to manufacture using high precision machining techniques.

By current methods, to form a base that contains internal cooling channels, two opposed pieces are formed by machining, in separate portions (e.g., an upper piece and a lower piece), and the two separately-formed pieces are bonded together, typically by a vacuum brazing step or an e-beam welding step.

Vacuum brazing is a specialized process used in the aerospace industry, and can be both expensive and not readily available. Vacuum brazing involves forming a bond between two opposed surfaces by melting a "filler material" placed between the two surfaces, using a furnace, and allowing the melted filler material to then solidify and form a bond or vacuum-brazed joint. The filler material may be a material that melts at a temperature lower than a melting temperature of the two pieces being bonded. The joint that is formed by the "filler" material is typically detectable in a final vacuum-brazed base structure. Overall, the combination of forming two separate pieces, each by complex machining steps, followed by a vacuum brazing step, results in high material and processing costs as well as potentially lengthy manufacturing lead times.

Alternative processes use formed tubing as cooling channels, followed by casting a material over the tubing to form the base.

The cost and difficulty of preparing a base can increase with the use of different and more desirable materials for use as an electrostatic chuck base. Desirable materials can include high hardness materials such as ceramics and various metal alloys such as titanium alloys. These materials are extremely hard, making them desirable for use in a base, but also making them very difficult to process by machining. Other desired materials may include materials that have a relatively low coefficient of thermal expansion, such as a coefficient of thermal expansion that is similar to that of a ceramic layer of a chuck assembly.

SUMMARY

In one aspect, the disclosure relates to an electrostatic chuck base. The base includes: an upper base surface, a lower base surface, an interior portion between the upper base surface and the lower base surface, and a channel within the interior portion. The channel includes: an inlet at a surface of the chuck base, an outlet at a surface of the chuck base, a length between the inlet and the outlet, and a cross section along the length that comprises. The cross section includes one of: a varied cross-sectional area along the length; a varied cross-sectional shape along the length; or a varied distance from the upper surface or the lower surface or both, along the length.

In another aspect, the disclosure relates to a method of making an electrostatic chuck base as described by an additive manufacturing method. The method includes: forming a first feedstock layer on a surface, the feedstock layer comprising inorganic particles; forming solidified feedstock from the first feedstock layer; forming a second feedstock layer over the first feedstock layer, the second feedstock layer comprising inorganic particles; forming second solidified feedstock from second feedstock layer, wherein the solidified feedstock layers are part of a multilayer composite electrostatic chuck base.

In another aspect, the disclosure relates to a method of forming an electrostatic chuck base as described, by an additive manufacturing method. The method includes: forming a lower base portion that includes the bottom surface, by additive manufacturing; forming a middle base portion that includes a channel, over the lower base portion, by additive manufacturing; and forming an upper base portion that includes the upper surface, over the middle base portion, by additive manufacturing.

BRIEF DESCRIPTION OF THE DRAWINGS

Reference is made to the drawings that form a part of this disclosure, and which illustrate embodiments in which the materials and methods described herein can be practiced.

Figure 1:
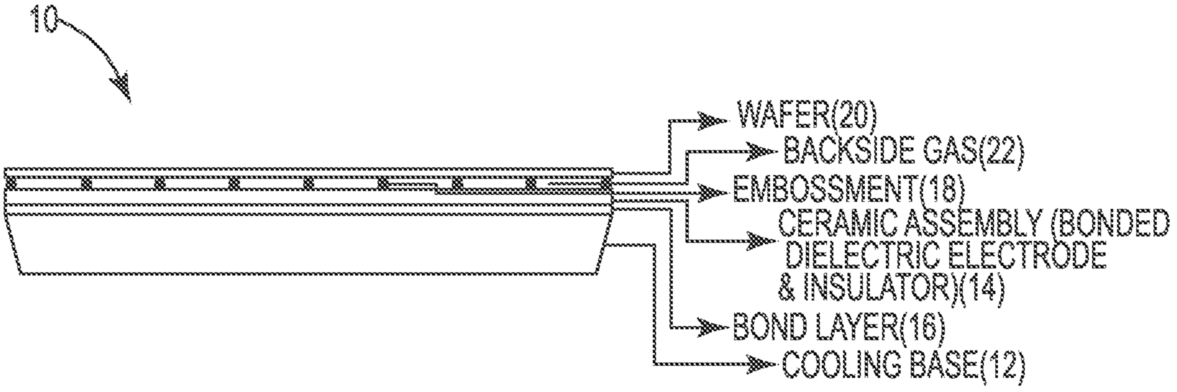
FIG. 1 is a side-view of an electrostatic chuck assembly as described.

The drawings are schematic, exemplary, and not necessarily to scale.

DETAILED DESCRIPTION

The following description relates to base structures that are useful in an electrostatic chuck. The base includes a pattern of channels distributed throughout the interior of the base that can be used to control temperature of the base by flowing fluid through the channels during use.

The base includes an upper base surface, a lower base surface, and an interior portion between the upper surface and the lower surface. The upper and lower surfaces are considered to extend over areas defined by an "x-direction" and a "y-direction." The distance between the upper surface and the lower surface is referred to as the thickness of the base in a "z-direction."

The base includes a channel that extends along a length through the interior of the base. The base includes an inlet to the channel at a surface of the base, an outlet of the channel at a surface of the base, a length of the channel between the inlet and the outlet, and a cross-sectional shape and area at all locations along the length. The term "channel" refers to a single channel or alternately to a portion or a segment of a channel. The term "channels" may be used to refer to a multiple channels, or to different portions or segments of a single channel that extends over a substantial area of the base. In some examples, a length of channel between an inlet and an outlet may also be referred to as a single channel.

According to conventional base structures, a base includes a channel that extends through the base interior, through which fluid can flow during use of the base as a component of an electrostatic chuck. The fluid may be any fluid, either a gas or a liquid, and may be caused to flow through the channel for any purpose. One purpose is to control a temperature of the base, an electrostatic chuck, and a workpiece supported by the chuck. Typically the fluid that flows through the channels is a cooling fluid, such as water, and for this reason the channels may sometimes be referred to as "cooling channels." The cooling channels can be useful for a flow of a different type of fluid, such as a purge gas that is effective to remove a cooling fluid from the channel and to dry the channel.

In conventional base designs, channels in the base (referred to sometimes as "cooling channels") have been designed to have a uniform cross-sectional form at all locations along the length of the channel, including a uniform cross-sectional shape and a uniform cross-sectional area. Also according to conventional base structures, cooling channels have been located at a uniform position, e.g., depth, within the base (in a "z-direction" along the thickness of the base); i.e., a conventional channel is located at a distance from the upper surface that is the same along the entire length of the channel (between an inlet and an outlet), and is located at a distance from the lower surface that is the same along the entire length of the channel (between an inlet and an outlet).

Compared to such conventional base structures, cooling channels of base structures of the present description have non-uniform physical features such as cross-sectional profile and positioning within the base thickness, that improve cooling efficiency of the base, cooling uniformity of the base, or both.

To improve efficiency or uniformity at which a cooling channel performs, the channel can be formed within the interior of the base to include physical features that change along the length of the channel. A channel may exhibit one or a combination of: a varied (non-uniform) cross-sectional area along the length; a varied (non-uniform) cross-sectional shape along the length; or a varied (non-uniform) position within the interior of the base, along the length, meaning a varied distance from the upper surface or the lower surface. In example base structures, cooling channels may be formed as a pattern of channels designed for improved efficiency and uniformity of heat transfer relative to a specific workpiece and non-uniform features of a specific workpiece that may be supported by a base assembly. This feature is sometimes referred to as "conformal cooling," and allows for the pattern of channels within the base to be designed and formed in the base in a specific design to match specific heat removal requirements of a workpiece (e.g., semiconductor or microelectronic device or wafer) that will be supported by an electrostatic chuck assembly during use.

Changing a size, shape, or position feature of a channel opening within the base interior can allow for improved control of temperature over an area of a base. During use to cool a substrate supported by a chuck, various factors can result in non-uniform heat transfer at a chuck upper surface, or non-uniform temperature at local areas of a chuck upper surface. As an example, heat transfer effects are different at an edge of a chuck, e.g., at the chuck perimeter, compared to non-edge portions of the chuck. Heat energy can escape the chuck laterally at the edge, causing a reduced temperature at surfaces of the chuck along the edge. To correct for the edge effect, i.e., to prevent a reduced temperature at an upper surface of the chuck near the edge, a cooling channel near an edge (i.e., a portion of a channel that is closes to the edge) may be located at a position that is closer to the upper surface of the chuck (i.e., may be at a reduced depth) compared to a cooling channel at a non-edge location.

As a separate effect, the cooling channel defines an enclosed "cooling loop" that starts at an inlet, extends along an entire length of the cooling channel within the chuck interior, and ends as cooling fluid exits the chuck at an outlet. The cooling fluid enters the cooling loop having a minimum temperature that occurs at the inlet. As the fluid passes through the channel the fluid takes on heat energy and the temperature of the fluid increases; an early portion of the cooling loop is a cooler portion, with lower cooling fluid temperature. At later portions of the channel, (warmer portions) nearer the outlet, the temperature of the fluid has increased and the fluid has a reduced capacity for removing heat from the chuck. A higher temperature at the chuck surface will occur at warmer portions of the cooling loop, which are nearer the outlet, because the cooling fluid has a higher temperature.

To prevent this type of temperature increase at the chuck surface, and non-uniform temperatures at the chuck surface, the cooling channel may be located in a z-direction at a position that is closer to the upper surface of the chuck in the latter (warmer) portions of the length of the channel, compared to the earlier (cooler) portions of the cooling loop. Placing the channel and the cooling fluid closer to the upper surface can allow for improved heat transfer from the surface to the fluid at the warmer portions of the cooling loop, where the cooling fluid has a higher temperature.

Stated generally, a distance of a cooling channel from an upper surface of the chuck (i.e., a position of the channel in the z-direction, or "depth") may be selected to affect a desired transfer of heat between the cooling fluid and a location of the chuck surface. This distance, or depth, may be measured between the upper surface of the base and a location of a channel that is closest to the upper surface, in a direction perpendicular to the upper surface. Generally stated, to increase an amount of heat transfer between a cooling fluid and a base surface, the channel can be positioned relatively close to the upper base surface (at a reduced depth, in the z-direction). To reduce an amount of heat transfer between a cooling fluid and a local area of a base surface, the channel can be positioned relatively farther from the upper base surface (at a greater depth, in the z-direction). A depth of a channel along a length of the channel may change at any rate along a length of the channel, gradually or non-gradually.

As a different manner of affecting a rate or amount of heat transfer between a cooling fluid and a chuck surface, a cross-sectional area of a cooling channel may be adapted to place a larger volume of cooling fluid at locations of the chuck surface that require a larger amount of heat removal. Generally stated, to increase an amount of heat transfer between a cooling fluid and a local area of a chuck surface, a cross-sectional area of the cooling channel may be increased. To reduce an amount of heat transfer between a cooling fluid and a local area of a chuck surface, a cross-sectional area of the cooling channel may be reduced. A change in a cross-sectional area of a channel may be provided as a gradual change, such as over a gradual tapered diameter increase, or may be in the form of a relatively abrupt change, such as a reduced-diameter orifice located between two portions of channel having the same diameter.

In a different example of improving temperature uniformity of an upper surface of a base during use, a system of cooling channels of a base may include main channels ("major" channels) and side channels ("minor" channels, "feeder" channels, "connecting" channels) that connect two other channel portions and allow for flow of cooling fluid between the two channel portions. The minor channels may be characterized as having a smaller cross-sectional area relative to a main channel, and as providing a relatively short length of a channel that connects one main channel to a second main channel. As an example, different portions of a systems of channels within a base will contain higher temperature (a warmer portion) and lower temperature (a cooler portion) cooling fluid.

To improve temperature uniformity in the different portions of the system of channels, a portion of a flow of cooling fluid from a cooler portion of a channel may be diverted from the cooler portion of the channel and added to a portion of flow of cooling fluid at a warmer portion. The diverted flow may flow from a main channel that is a cooler portion, that has a main channel cross-sectional area, to a different main channel that is a warmer portion and that also has a main channel cross-sectional area. The diverted flow may pass from the cooler portion to the warmer portion through a side channel that connects the two portions, with the side channel having a reduced cross-sectional area relative to the two main channels (each having a larger cross-sectional area). The reduced cross-sectional area of the side channel will be sized to provide an amount of flow (flow rate) from the cooler channel portion to the warmer channel portion that will provide a desired reduction of temperature of the flow of cooling fluid in the warmer portion.

As yet another different design feature, a portion of a cooling channel may pass over or under (i.e., "criss-cross," without connecting) a different portion of a cooling channel, with the two channels being located at different depths (in a z-direction) within the thickness of the base, and the same x- and y-location relative to an area of a base surface. By some designs, crossing one channel over a different channel can be useful to produce a pattern of channels that provide improved distribution of colder and warmer sections of the cooling loop.

For example, some channel designs separate a base into a left half and a right half, and include a closed loop channel on each half, with the two channels starting at a single inlet and ending at a single outlet. With this type of a two-channel system, with each channel serving to cool approximately one-half of the base, a criss-crossed channel portion allow cooling fluid on both sides (i.e., two halves) of a base to flow through channel portions that are at an edge of a base before the cooling fluid flows through channel portions that are at non-edge portions of the base. See description of FIG. 7 below.

An electrostatic chuck as described is a multi-piece (or "multi-component") structure that includes multiple separately-prepared or individually-prepared pieces (components) assembled together in layers to form an electrostatic chuck assembly. The assembly includes various structures and features that are typical of an electrostatic chuck assembly and that allow the chuck to support a workpiece (e.g., semiconductor substrate, a microelectronic device, a semiconductor wafer, a precursor thereof) during processing, with an electrostatic attractive force holding the workpiece in place at an upper surface of the chuck (referred to as the "workpiece-contacting surface"). Example workpieces used with an electrostatic chuck include semiconductor wafers, flat screen displays, solar cells, reticles, photomasks, and the like. The workpiece may have an area equal to or greater than that of a circular 100 millimeter diameter wafer, a 200 millimeter diameter wafer, a 300 millimeter diameter wafer or a 450 millimeter diameter wafer.

The chuck includes an upper "workpiece-contacting surface" that is adapted to support a workpiece during processing. The upper surface typically has a circular surface area with a circular edge that defines a perimeter of both the workpiece-contacting surface and the multi-layer chuck. As used herein, the term "workpiece-contacting surface" refers to the upper exposed surface of an electrostatic chuck that contacts a workpiece during use and that includes a "main field" made of a ceramic material and having an upper surface, typically with embossments at the upper surface, and with an optional conductive coating that may cover a least a portion of the upper surface. The workpiece is held at the workpiece-contacting surface, in contact with upper surfaces of the embossments, above the upper surface of the ceramic material, and is held against or "clamped" to the electrostatic chuck during use of the electrostatic chuck. Example electrostatic chuck assemblies may be used with AC and DC Coulombic chucks and Johnsen-Rahbek chucks.

The chuck assembly (or "chuck" for short) also includes a number of other layers, devices, structures, or features that are required or optional for the chuck to function. These may include: an electrode layer that generates an electrostatic attraction between the chuck and the workpiece to hold the workpiece in place during processing; a grounding device such as a grounding layer and related electrical connections; measurement devices for measuring pressure, temperature, or an electrical property during a processing step; gas flow conduits (cooling channels) as part of a temperature control function; backside gas flow function for gas flow and pressure control between the workpiece-contacting surface and a workpiece; a conductive surface coating; as well as others.

One layer of a typical chuck assembly is a ceramic layer (a.k.a., a dielectric layer) at an upper portion of the assembly. The ceramic layer may be a top layer of the assembly and may include the upper surface of the chuck, other than a conductive coating, embossments, or the like, which may be placed on the upper surface of the ceramic layer. An electrically conductive coating at the upper surface may be connected to electrical ground through a grounding layer, a grounding pin, or the like, also included in the chuck assembly. The ceramic layer may be made of a useful ceramic material such as alumina, aluminum nitride, quartz, $SiO_2$ (glass), among others. The ceramic layer may be made of a single (integral) layer of material, or may alternately be made of two or more different materials, e.g., multiple layers of different materials, if desired. A total thickness of a ceramic layer (having one or multiple layers of ceramic materials) may be any effective thickness, for example a thickness in a range from 1 to 10 millimeters, e.g., from 1 to 5 millimeters.

The ceramic layer is supported below by a base layer ("base" for short), as described herein, which may be made of a metal, such as aluminum, aluminum alloy, titanium, titanium alloy, stainless steel, metal matrix composite, among others as described.

Typically between the ceramic layer and the base is one or more of: a bonding layer (e.g., a polymeric adhesive), an electrode, a grounding layer, an insulating layer that allows the electrodes and other layers to function electrically, or additional circuitry.

An example of a useful chuck assembly is shown at FIG. 1. Chuck assembly 10 includes base 12, ceramic layer (assembly) 14, and a bonding layer 16 that bonds base 12 to ceramic layer 14. Ceramic layer 14 includes subcomponents such as an electrode (not specifically shown). At an upper surface of ceramic layer 14 is a pattern of embossments 18. As illustrated, wafer 20 is supported by the embossments. A space 22 is present between a lower surface of wafer 20 and an upper of ceramic layer 14. Space 22 is created by embossments 18 located at the upper surface of ceramic layer 14, which support wafer 20 at a slight distance above the upper surface of ceramic layer 18. During use, a flow of cooling gas can be passed through space 22, between wafer 20 and ceramic layer 14, to control (e.g., reduce) a temperature of wafer 20. Base 12 contains cooling channels, which are not specifically illustrated.

A chuck assembly of the present description includes a base structure that includes cooling channels. A base structure as described includes cooling channels that have non-uniform features, such as a non-uniform position at the base interior in a z-direction, non-uniform cross-sectional area, or non-uniform cross-sectional shape. These feature can be effective to improve cooling efficiency and cooling (temperature) uniformity of the base, of the chuck and of a supported workpiece, regardless of how the features are produced as part of the base, i.e., regardless of what type of process is used to produce the features and the entire base structure. Accordingly, the disclosure of the present description does not require any particular method of preparing a base to include a cooling channel having the described non-uniform features, to effect improved cooling efficiency and cooling uniformity.

Still, to produce non-uniform features of a cooling channel that have significant complexity, such as a system of channels having a combination of varied shape, cross-section, and depth, optional criss-crossing, and optional connecting channels, additive manufacturing methods can be particularly effective. Accordingly, the present description will mainly use terms that refer to additive manufacturing methods, even though a base structure of this description is not required to be prepared by an additive manufacturing method.

A cooling channel formed by an additive manufacturing technique may be more precise compared to channels formed using presently-known machining techniques, may be formed with alternative cross-sectional shapes (that cannot be formed by machining), may be formed to more intricate (serpentine, three-dimensional) patterns, may be readily formed in three dimensions within the base interior, and may be readily formed in a base at a high channel density or with interconnected channels. Examples of cross-sectional shapes of a cooling channel include shapes that are circular, triangular, hexagonal, dome-shaped (curved on one end and flat at an opposite end), and teardrop-shaped.

According to preferred additive manufacturing methods an entire base structure, including the internal cooling channels, can be produced using an additive manufacturing technique. A system of cooling channels can be formed in a base structure by an additive manufacturing method as a pattern or system of connected, optionally inter-connected open spaces (e.g., "void" spaces) that form a closed loop channel that extends over an area of the base interior. A channel is defined by an absence of a material of a base, at locations of the channel, and no other structure is necessary to form or define the structure of the channel within the base. A channel runs throughout an interior of a base layer and require no structure or surface other than a space that is formed within the base structure during formation of the base, e.g., by an additive manufacturing method.

A channel is defined by surfaces of the material of the base, with no other material needed at the surface. In specific, a cooling channel does not contain or require an additional structure other than the structure of the base, such as a separate tube, piping, or a conduit that is formed separately from the base structure and combined with or placed within the base structure. In use, cooling fluid flows through the cooling channels in contact with sidewalls made of the material of the base, with no other material present to form or define the interior surface of the channel.

Cooling channels function to circulate cooling fluid (e.g., water or another cooling liquid) through the interior portion of the base to remove heat from the base, chuck, and a supported workpiece and to control the temperature of the base, chuck, and workpiece. The channels are formed at the interior of the base and extend two-dimensionally in x- and y-directions relative to an area of the base surface when viewed vertically (e.g., from above, from a "top view"), and optionally in a vertical direction (z-direction) along a thickness of the base. The cooling channels include at least one inlet in the base that allows the cooling fluid to enter the base, and at least one outlet that allows the fluid to exit the base. Between the inlet and the outlet is a closed loop of the channel or system of channels.

Figure 2A:
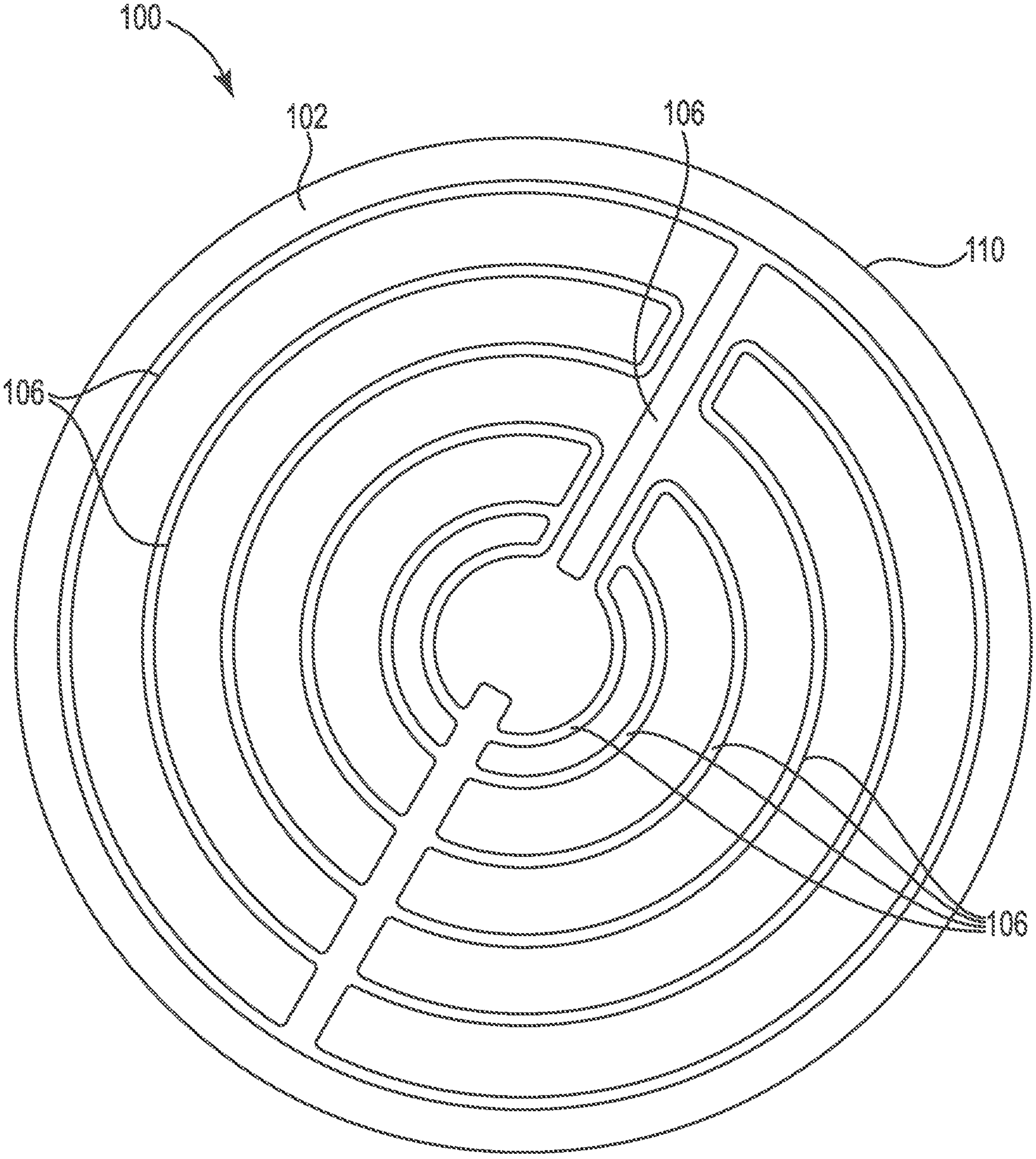
FIG. 2A is a top view of a base as described.
Figure 2C:
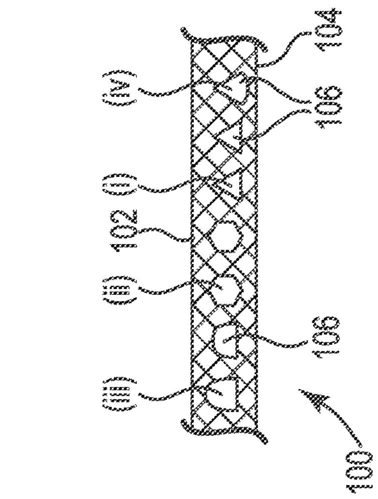
FIGS. 2B and 2C show side cut-away views of a base as described.
Figure 2B:
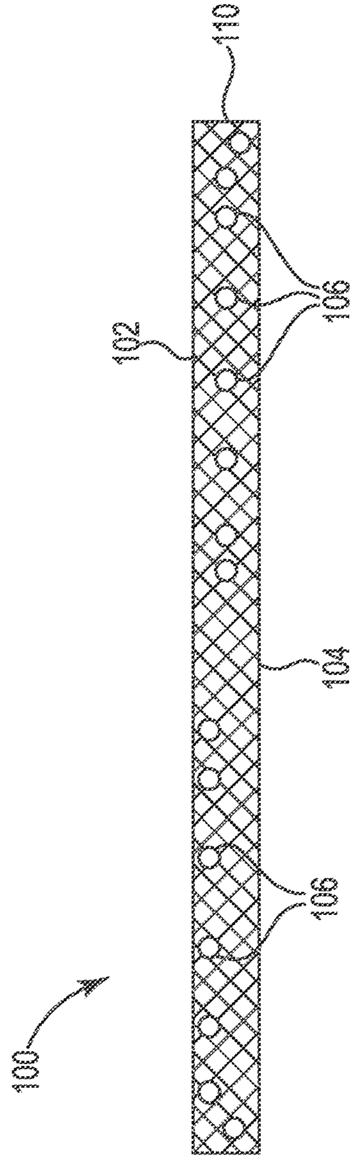

FIGS. 2A and 2B illustrate a single generic example of base 100 of the present description, including channels as described. Base 100 includes a perimeter 110, an upper surface 102 a lower surface 104 (each having an area that extends in both an x-direction and a y-direction), and a thickness (in a z-direction) between the two opposed surfaces. Cooling channel 106 (shown at FIG. 2B as having circular cross-sections) is present as a serpentine pattern at an interior portion of the base.

Not shown at FIG. 2A is that different portions of channel 106 may also have different cross-sectional shapes, different cross-sectional areas, or different depth locations within the thickness direction (z-direction) of base 100. FIG. 2B shows that different portions of channel 106 that are located at different locations in the thickness direction.

FIG. 2C shows examples of cross-sectional shapes of a cooling channel, including cross-sections that are triangular (i), hexagonal (ii), dome-shaped (curved on one end and flat at an opposite end) (iii), and teardrop-shaped (iv).

In these or other cross-sectional shapes, other non-uniform features of a cooling channel can be also incorporated into the base design. For example, a cooling channel may be formed to have a larger volume toward a top surface of a base compared to a bottom surface of the base; a channel may be shaped with a larger portion of the channel toward the top surface, or with different portions of a channel being located at different distances from the upper surface of the base and the lower surface of the base. A channel may have portions that are located at different positions along the thickness of the base. Alternately or additionally, a cross-sectional profile of a cooling channel may vary based location within the base; a cross section of a channel may be smaller in size (cross-sectional area) or shaped differently at a portion of the base near the base center, and may be larger or shaped differently at an edge (or vice versa) to allow for more uniform heat transfer and improved temperature control at the upper base surface. In other example designs, two channel or channel portions (main channels) may be connected by smaller "side channels" having a smaller cross-sectional area than a main channel, to allow flow of cooling fluid from one portion of a channel to a different portion of a channel.

Figure 3A:
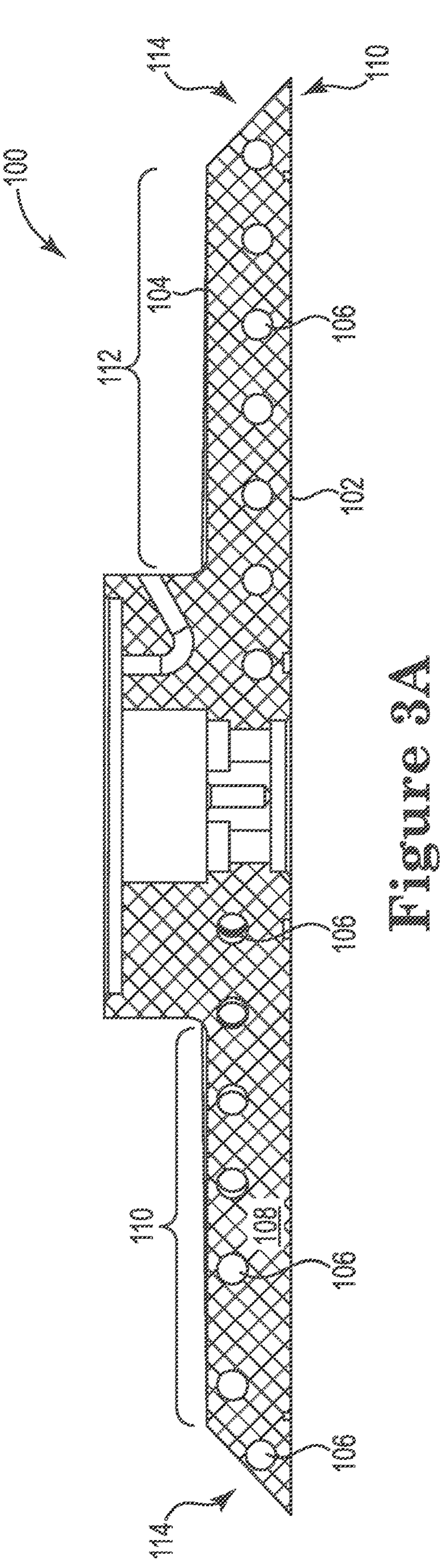
FIGS. 3A and 3B show side cut-away views of a base as described.
Figure 3B:
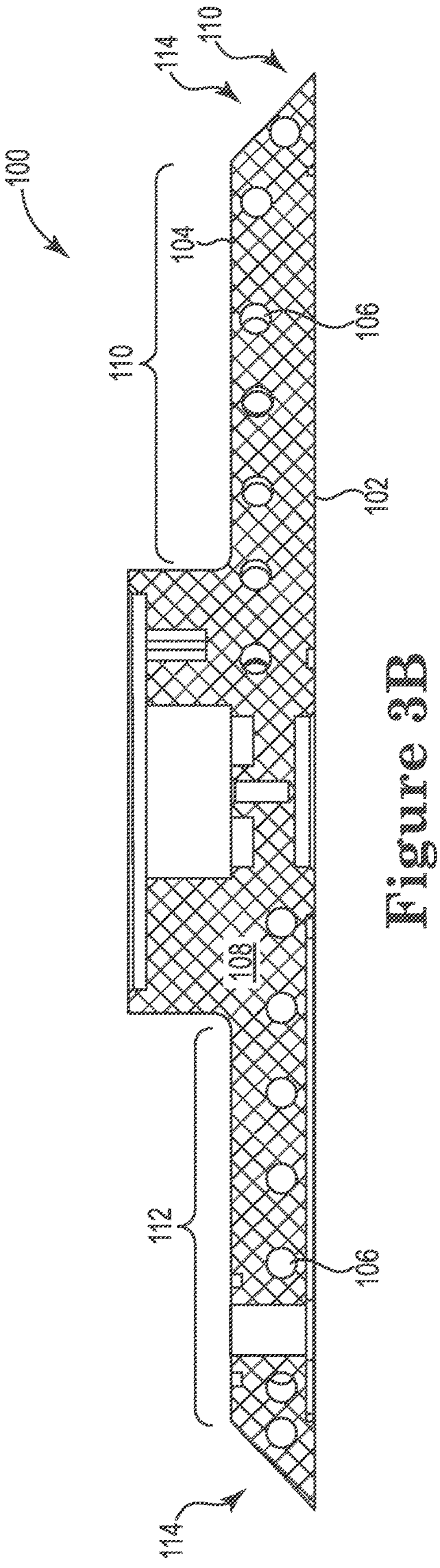

Referring now to FIGS. 3A and 3B, illustrated are two opposed cross-sectional side views of a base as described herein. Features are designated numerically in accordance with the features of FIGS. 2A, 2B, and 2C, but details of the structures may be different. At FIGS. 3A and 3B, a left side and a right side of base 100 are shown in cross-section to illustrate locations of channels 106. Base 100 includes a perimeter 110, an upper surface 102 a lower surface 104 (each having an area that extends in both an x-direction and a y-direction), and a thickness (in a z-direction) between the two opposed surfaces. Cooling channels 106 extend within an interior of solid base material 108.

In this example, channels 106 are made of a similar cross-sectional shape (circular) and cross-sectional size along the entire length of the channel or system of channels. But different portions of base 100 include channels 106 located at different distances (depths) from upper surface 102. Portion 110 is considered to be a cooler portion of channels 106, is upstream from a warmer portion 112, and carries fluid at a relatively lower temperature. Cooling fluid flows into channel 106 at an inlet, flows first through cooler portion 110, then flows second through warmer portion 112. Portion 112, the warmer portion, contains cooling fluid that has become heated slightly compared to fluid contained upstream, in cooler portion 110. To adjust for the increased temperature of the cooling fluid as the fluid passes through warmer portion 112, channels 106 of warmer portion 112 are positioned nearer to upper surface 102 compared to channels 106 of cooler portion 110.

Similarly, edge portion 114, due to the exposed surface of base 100 at perimeter 110, absorbs a higher amount of heat from the atmosphere compared to either of cooler portion 110 or warmer portion 112. This increased amount of heat that is added to edge portion 114 increases the temperature of edge portion 114 and cooling fluid that passes through channels 106 at or near edge portion 114. To adjust for a loss of cooling capacity of water that flows through edge portion 114, channel 106, at edge portion 114, can also be located nearer to upper surface 102, e.g., compared to channels 106 of cooler portion 110.

Figure 4:
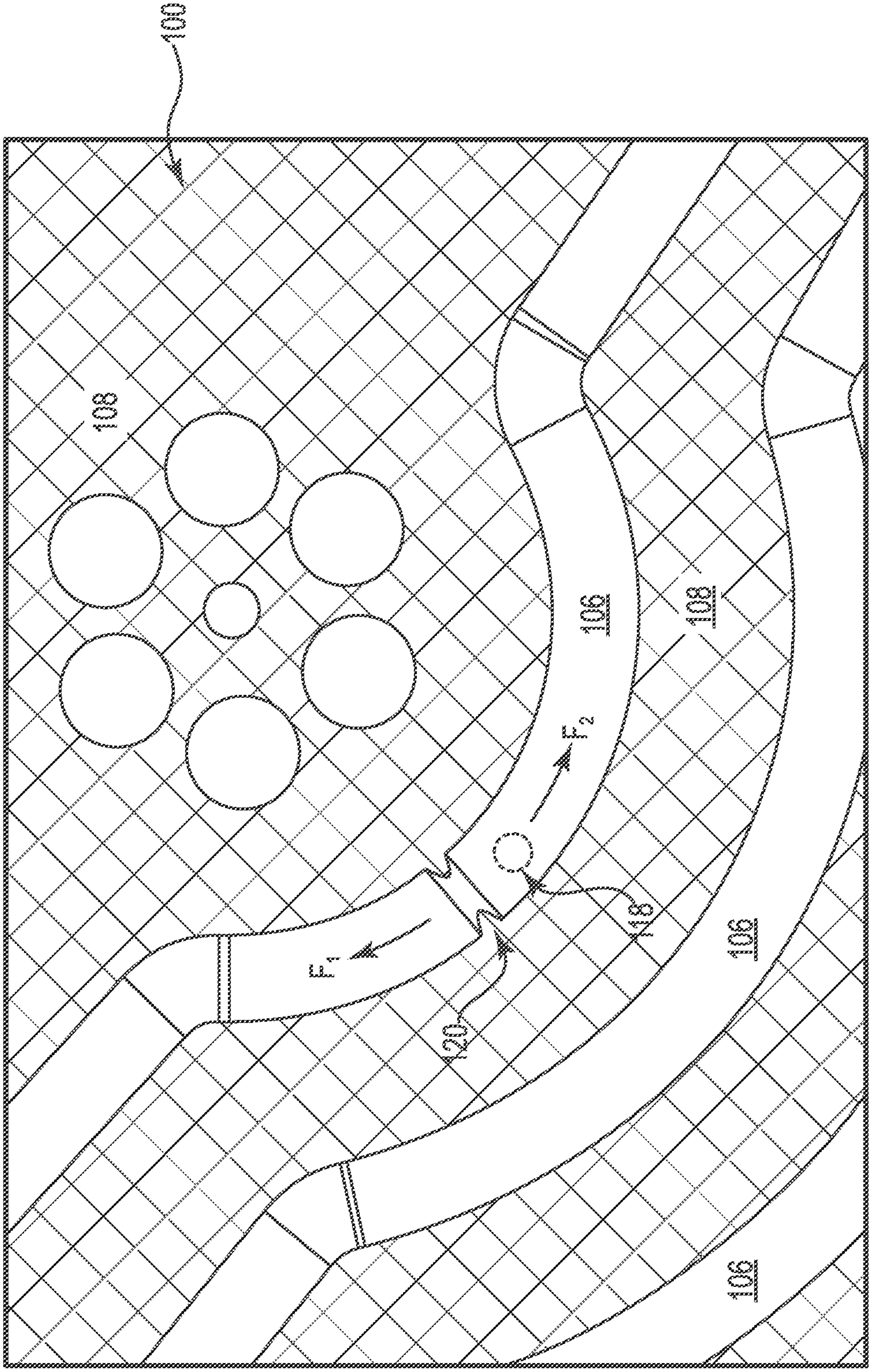
FIG. 4 shows a top cut-away view of a base as described.

FIG. 4 is a cross-sectional top view of a base as described herein. Features are designated numerically in accordance with the features of FIGS. 2A, 2B, and 2C, but details of the structures may be different. At FIG. 4, base 100 is shown in cross-section with details of channels 106 extending through solid base material 108 in x- and y-directions. Three channels 106 are illustrated, each having a cross sectional shape that is circular and a cross-sectional size (area) that is essentially uniform along the length of channel 106.

Channel 106 is connected to inlet 118, which passes through a surface (not shown) of base 100. In use of base 106, cooling fluid enters channel 106 through inlet 118 and flows in two directions as first flow, F1 and second flow F2. Near inlet 118, channel 106 include a reduced diameter portion or orifice 120, which affects the relative amounts of flow F1 and F2 as cooling fluid enters channel 106 through inlet 118. Orifice 120 is a constricting orifice, which will allow a reduced volume of flow through channel 106 at the location of orifice 120. A result is that due to the constricting effect of orifice 120, flow F2 is a greater rate of flow (volume of fluid per time), and flow F1 is a lower rate of flow.

Figure 5:
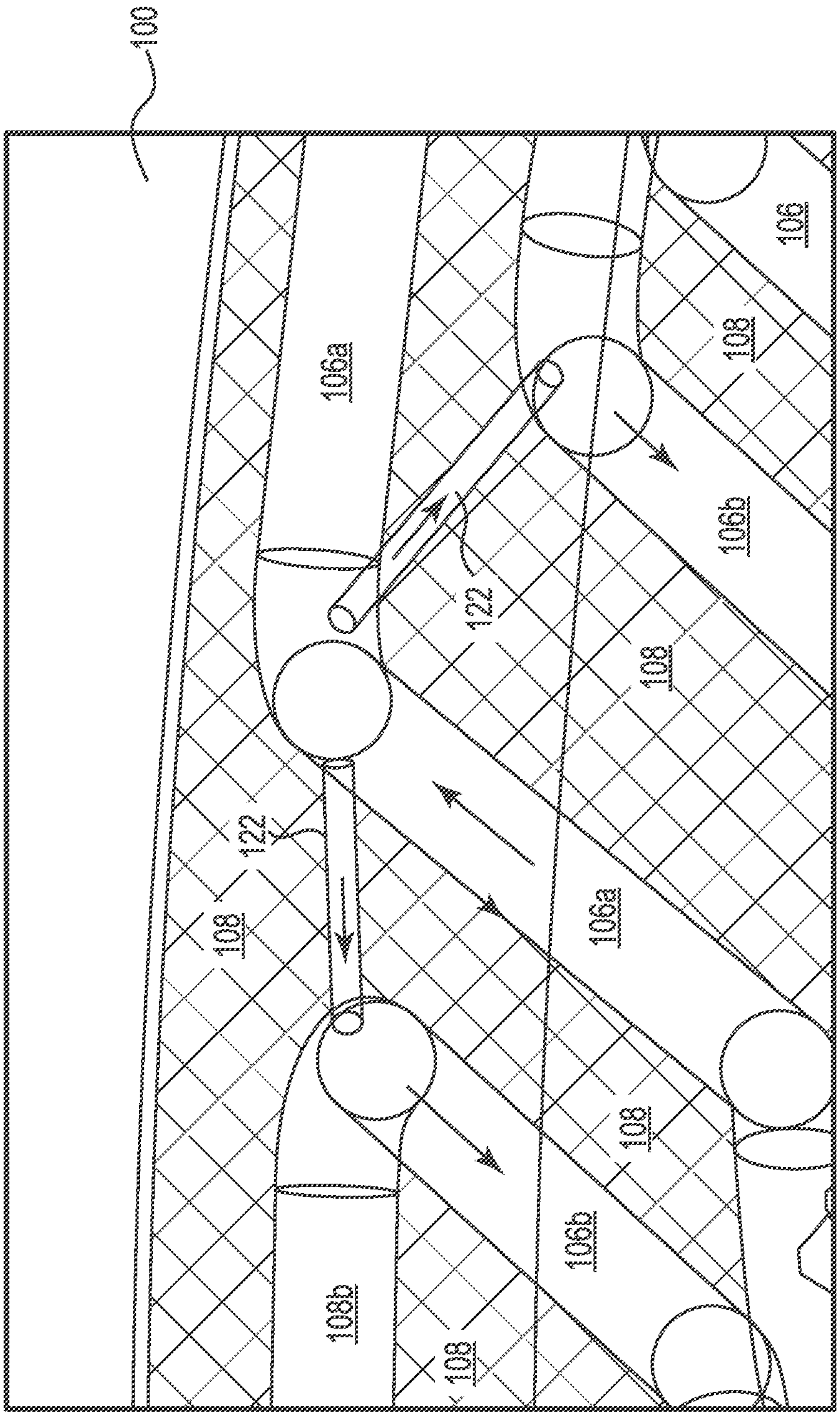
FIG. 5 shows a perspective cut-away view of a base as described.

FIG. 5 is a cross-sectional perspective view of a base as described herein. Features are designated numerically in accordance with the features of FIGS. 2A, 2B, and 2C, but details of the structures are different. At FIG. 5, base 100 is shown in cross-section with details of main channels 106 (a, b) and smaller (in length and cross-sectional area) side channels 122 extending through solid base material 108 in x- and y-directions.

The system of channels of FIG. 5 includes main channels ("major" channels) 106 (a, b) connected by side channels ("connecting" channels) 122. Side channels 122 have a smaller cross-sectional area relative to main channels 106 and also have a relatively short length that extends between two main channels to connect the flow of the two main channels. In this example, main channel 106*a* contains a flow of cooling fluid that has a lower temperature than cooling fluid that is flowing through channels 106*b*. Main channel 106*a* is upstream closer to an inlet relative to main channel 106*b*, i.e., "upstream" from channel 106*b*.

To improve temperature uniformity within base 100, flow of cooler fluid in channel 106*a* is diverted from the cooler portion channel 106*a* into each of the two warmer channels 106*b*. The diverted fluid flows from cooler channel 106*a* to warmer channels 106*b*, through each of side channels 122 (see arrow, indicating direction of flow). Each side channel 122 has a reduced cross-sectional area relative to main channels 106*a* and 106*b*, which each have a larger cross-sectional area. The reduced cross-sectional areas of side-channels 122 provide an amount of flow (flow rate) from the cooler channel portion 106*a* to the warmer channel portions 106*b* that will provide a desired reduction of temperature of the cooling fluid in warmer channel portions 106*b*.

Figure 6:
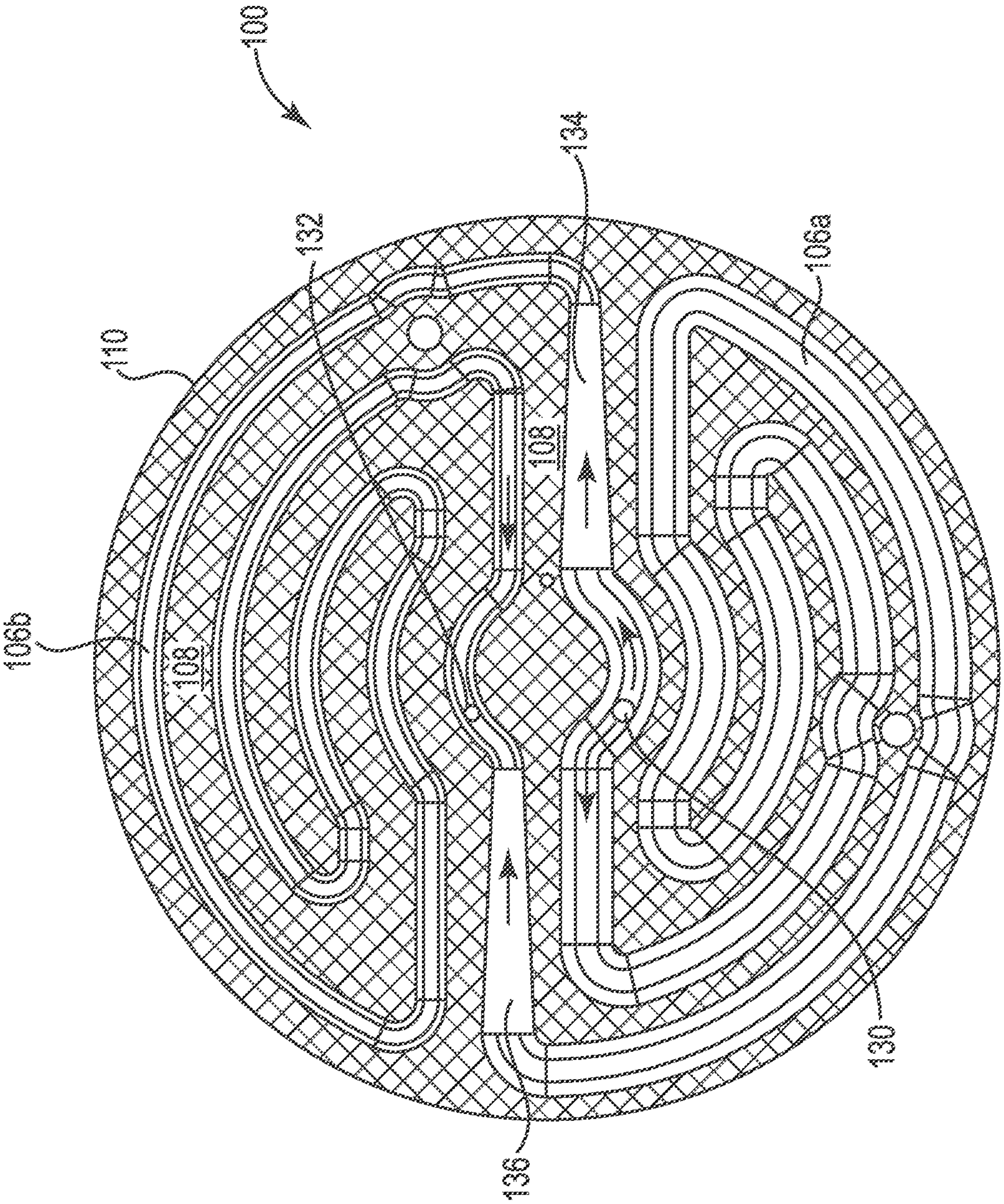
FIG. 6 shows a top cut-away view of a base as described.

FIG. 6 is a top cross-sectional view of a base as described herein. Features are designated numerically in accordance with the features of FIGS. 2A, 2B, and 2C but details of the structures are different. At FIG. 6, base 100 is shown in cross-section with details of channels 106*a* and 106*b*, each extending as a closed loop through solid base material 108 in x- and y-directions. Cooling fluid enters base 100 at inlet 130 and the flow splits into two directions as shown in by the flow arrows.

Channel 106*a* includes a closed loop between inlet 130 and outlet 132 that covers approximately half of the surface area of base 100. Channel 106*b* includes a closed loop between inlet 130 and outlet 132 that covers approximately half of the surface area of base 100. In a first flow direction (left, as illustrated) the cooling fluid flows through channel 106*a*, which has a relatively large cross-sectional area, over an area of a bottom (as illustrated) half of base 100. At the end of channel 106*a*, the channel has a reduced-diameter taper 136. After passing through the taper the fluid exits channel 106*a* through outlet 132.

In a second flow direction from inlet 130 (right, as illustrated) the cooling fluid flows into channel 106*b* and taper 134 to a portion of channel 106*b* on a top (as illustrated) half of base 100. Channel 106*b* has a relatively smaller cross-sectional area compared to channel 106*a*. At the end of this reduced-diameter channel 106*b*, is outlet 132.

According to the present description, consistent with example base 100 of FIG. 6, different features of channels of a base all have individual effects, but combinations of two or more features may be used together to achieve desired temperature control at different areas of the base. In specific examples, channels having different combinations of depth, cross-sectional area, and cross-sectional shape, may be designed within a base to control local temperature variations in an electrostatic chuck that may occur during use of the chuck to support a workpiece. With regard to base 100 of FIG. 6, channel 106*a* and channel 106*b* have different cross-sectional areas, and, while not specifically depicted, may also be at different cross-sectional depths in the z-direction of base 100. Generally, a channel of a base may include portions of the channel that exhibit combinations of different depth locations and different cross-sectional area or shape. A useful effect of a channel design that includes combinations of these features can be effective heat-removal and temperature uniformity of the base during use.

Figure 7:
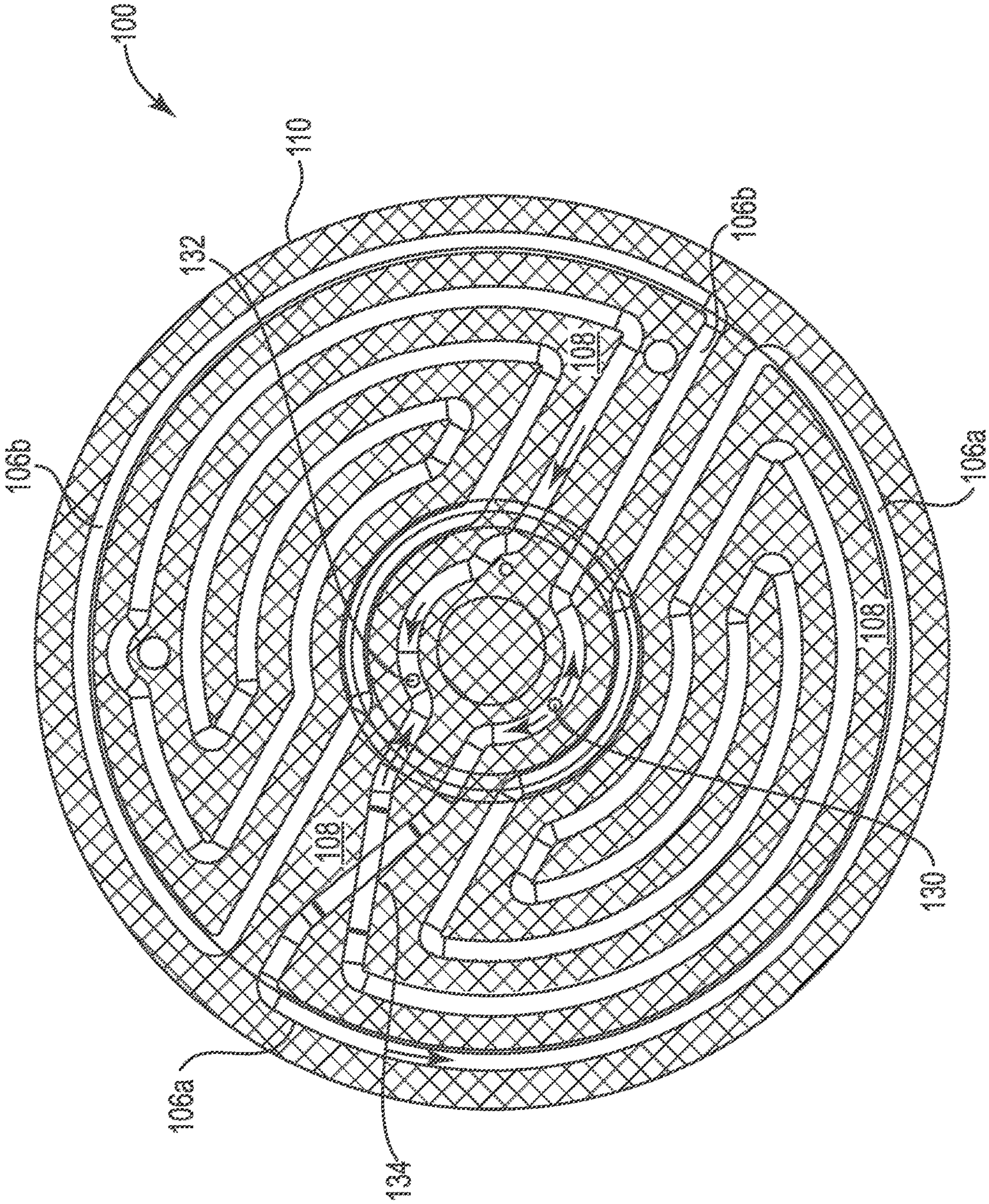
FIG. 7 shows a top cut-away view of a base as described.
Figure 8:
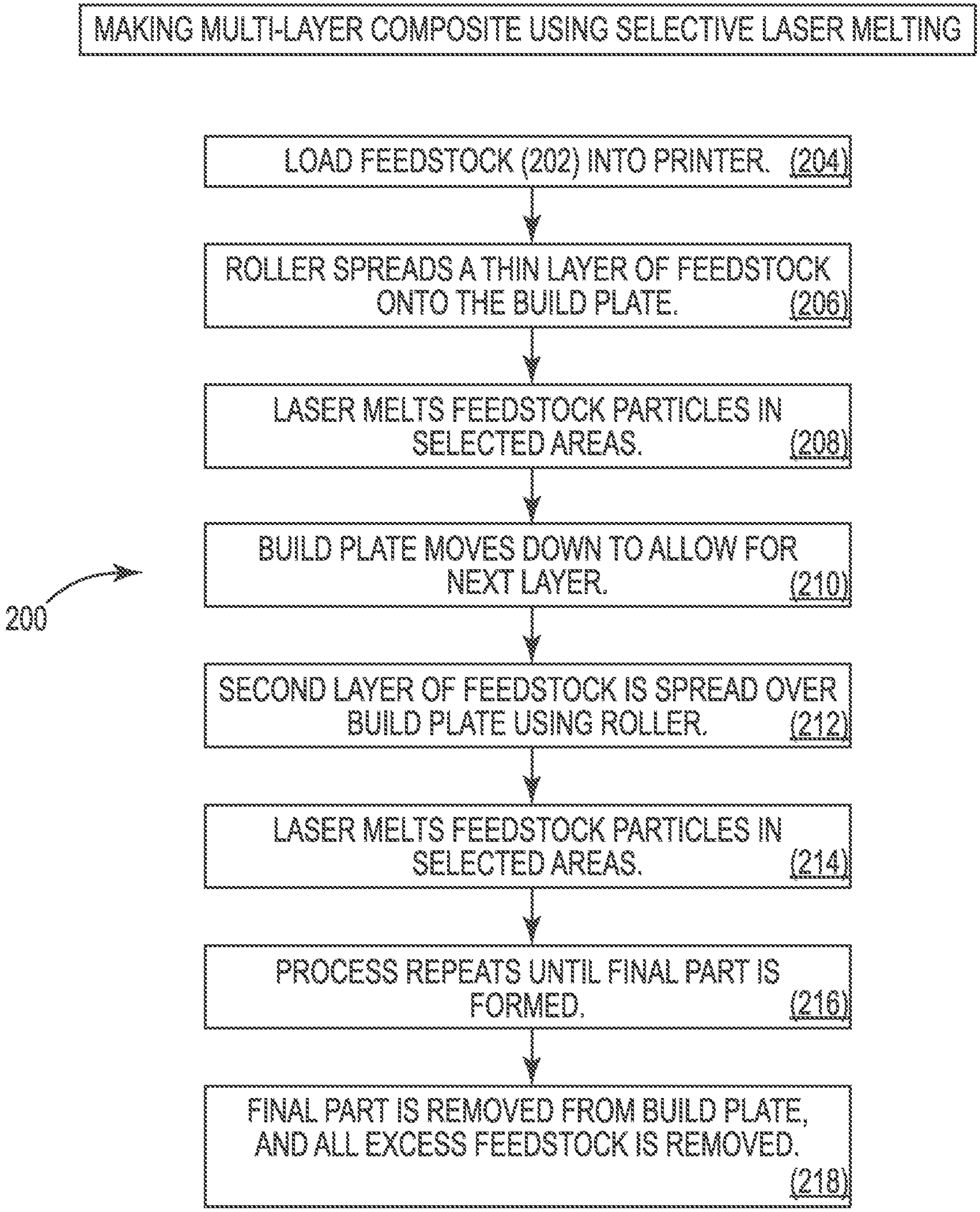
FIG. 8 shows steps of an example method as described.

FIG. 7 is a top cross-sectional perspective view of a base as described. Features are designated numerically in accordance with the features of FIGS. 2A, 2B, and 2C but details of the structures are different.

At FIG. 7, base 100 is shown in cross-section with details of channels 106 extending as a closed loop through solid base material 108 in x- and y-directions. Channel 106*a* includes a closed loop between inlet 130 and outlet 132 that covers approximately half (a lower-left half, as illustrated) of the surface area of base 100. Channel 106*b* includes a closed loop between inlet 130 and outlet 132 that covers approximately half (an upper-right half) of the surface area of base 100.

Cooling fluid enters channel 106 at inlet 130 and the flow splits into two directions as shown by the flow arrows. In a first flow direction (left and up, as illustrated), cooling channel 106*a* extends immediately to an outer region of base 100 and passes near a base edge at perimeter 110. In a second flow direction (right, as illustrated), cooling channel 106 extends immediately the opposite different outer region of base 100 and passes near an edge of base 100 at perimeter 110. By extending to these edge portions of base 100 upon initially entering channels 106*a* and 106*b* at inlet 130, the cooling fluid is at an original (minimum) temperature when passing through the edge portions of channels 106*a* and 106*b*, at the edge region of base 100. Each of the two channels extends throughout a different half of base 100 (upper right for channel 106*b* and lower left channel 106*a*). After passing through a closed loop in a respective half of base 100, each flow exits channel 106*a* and 106*b* by passing through outlet 132.

At intersection 134, channel 106*a* passes below (in a z-direction) channel 106*b* at non-connected intersection 134. At intersection 134, the two channels are at different z-direction depths within the thickness of base 100, so while the two channels are located at the same x and y locations of base 100, the flow within the two channels does not connect. Advantageously, non-connected intersection 134 allows the two different flows at inlet 130 (flow to the right, and flow to the left) to each proceed first to an edge portion of base 100.

The following description relates to methods for preparing solid, substantially non-porous, three-dimensional base structures that can be useful as a component of an electrostatic chuck assembly, having cooling channels as described, by additive manufacturing methods. These include methods that are commonly referred to as "3-D printing" techniques.

Different versions of additive manufacturing techniques are known. Additive manufacturing methods generally involve a series of individual layer-forming steps that sequentially form multiple layers of solidified feedstock composition derived from a layer of feedstock. Using a series of additive manufacturing steps, each step forming a single layer of a structure, multiple layers of solidified feedstock are sequentially formed into a structure that is referred to herein as a multi-layer composite (or "composite").

As used herein, the term "composite" (or "multi-layer composite") refers to a structure formed by additive manufacturing by sequentially forming a series of multiple individual and individually-formed layers of solidified feedstock. The composite takes the form of a base of an electrostatic chuck ("base") that includes each of a top portion (having a top surface), a bottom portion (having a bottom surface), and an interior portion (e.g., containing cooling channels), with all three portions being formed and held together exclusively by layer formation steps of an additive manufacturing method (e.g., without using a vacuum brazing step or any other type of bonding step to bond together two separately-produced pieces), and may be referred to herein as a "continuous" base or a "continuous layer" of a base.

The term "continuous" in this context means that the base or layer structure is formed as a single-piece composite structure from multiple sequentially-formed layers. The term "continuous" does not refer to a structure that is prepared by separately forming two individual pieces and then bonding the two separately-formed pieces together, for example by a vacuum brazing technique or a different type of bonding technique. A continuous base structure will not include a scam or a boundary that results from a bonding step, especially a scam or boundary that is made of a bonding or filler material that has a composition that is different from the materials of the base.

One specific example of an additive manufacturing technique is the technique commonly referred to as "selective laser melting." Selective laser melting (SLM), also known as direct metal laser melting (DMLM) or laser powder bed fusion (LPBF), is a three-dimensional printing method that uses a high power-density laser to melt solid particles of a feedstock material, which allows the melted (liquid) material of the particles to flow to form a continuous layer of the melted material, and then allows the continuous layer to cool and solidify to form solidified feedstock. According to certain particular example methods, the particles of the feedstock can be fully melted to form a liquid (i.e., liquefied), and the liquid material is allowed to flow to form a substantially continuous, substantially non-porous (e.g., greater than 80, 85, or 90 percent porosity) film that then cools and hardens as a solidified feedstock layer of a multi-layer composite.

Selective laser melting methods include features that are similar to another additive manufacturing technique known as selective laser sintering ("SLS"). Selective laser sintering uses laser energy to cause particles of a feedstock material to become sintered, i.e., fused without particles being melted. This results in a structure formed by material of the heated particles, with spaces between the particles, meaning that the structure is porous. In contrast, selective laser melting can be used to cause particles to become fully melted to form a solid (substantially non-porous) three-dimensional structure.

Additive manufacturing techniques may be useful for forming base structures made from a broad range of materials, including metal materials (including alloys) and metal matrix composite materials. With additive manufacturing techniques, including selective laser melting techniques, the range of possible metals, alloys, and metal matrix composites that can be used to form a base can advantageously include materials that are not easily formed into a useful base structure by previous techniques such as machining techniques. The range of materials available with additive manufacturing techniques includes metals and metal alloys that can be melted by laser energy, such as aluminum alloys, titanium alloys, and various metal matrix composite materials, some of which are not easily processed by machining. Example materials may exhibit such high hardness that the materials can be difficult to process by machining techniques to form precise structures of an electrostatic chuck base, including precise dimensions and intricate cooling channels. Using additive manufacturing techniques, these materials can be processed to form a base structure that includes intricate enclosed ("buried") cooling channels, even from materials that would be difficult to similarly form by using standard machining techniques.

The material that is used to prepare the base may be any material that is useful for preparing a base of an electrostatic chuck assembly, for example inorganic materials that include various metals (including alloys) and metal matrix composites. The term "metal" is used herein in a manner that is consistent with the meaning of the term "metal" within the metal, chemical, and additive manufacturing arts, and refers to any metallic or metalloid chemical element or an alloy of two or more of these elements.

The term "metal matrix composite" ("MMC") refers to a composite material made to include at least two constituent parts or two phases, one phase being a metal or metal alloy and another phase that is a different metal or another non-metal material such as a fiber, particle, or whisker, that is dispersed through a metallic matrix. The non-metal material may be carbon-base, inorganic, ceramic, etc. Some example metal matrix composite materials are made of combinations of: an aluminum alloy with alumina particles; an aluminum alloy with carbon; an aluminum alloy with silicon; an aluminum alloy with silicon carbide (SiC); a titanium alloy with $TiB_2$; a titanium alloy with silicon; a titanium alloy with silicon carbide (SIC).

Metal and metal alloys that may be useful according to methods of the present description include metal and metal alloys that have in the past been used for preparing base structures for electrostatic chuck assemblies, and, additionally, other materials that have not. Useful or preferred materials include metals such as iron alloys (e.g., stainless steel and other types of steel), titanium and titanium alloys, aluminum and aluminum alloys, and various metal matrix composite materials.

According to the present methods, a base may be prepared from a larger variety of materials than may be used for preparing a base from previous methods (e.g., machining methods). With a larger variety of materials available, a material for a base may be selected to provide physical properties that are particularly useful or desired in a base of an electrostatic chuck assembly, and in consideration of the materials used for other components of the assembly, such as an adjacent ceramic layer.

Coefficient of thermal expansion ("CTE") is a known physical property of metal, metal matrix composite, and ceramic materials. A material of a base layer of the present description, generally, may have a coefficient of thermal expansion that is comparable to coefficients of thermal expansion of various metal and ceramic materials that have been used previously to form components of base assemblies of electrostatic chucks. Some example materials that may be useful as a base or a ceramic layer of a base assembly as described, and their approximate CTE values, are as follows: alumina ($8.1\times10^{-6}$ m/(m K)), aluminum (21 to $24\times10^{-6}$ m/(m K)), Aluminum Alloy (AlSi7Mg) (21 to $22\times10^{-6}$ m/(m K)), aluminum nitride ($5.3\times10^{-6}$ m/(m K)), stainless steel 440C ($10.2\times10^{-6}$ m/(m K)), stainless steel 17-4PH ($10.8\times10^{-6}$ m/(m K)), steel M2 (Tool) ($11\times10^{-6}$ m/(m K)), titanium ($8.6\times10^{-6}$ m/(m K)), titanium alloy Ti-6Al-4v (TC4) (8.7 to $9.1\times10^{-6}$ m/(m K)).

In exemplary terms, a useful or preferred coefficient of thermal expansion of a metal or metal matrix composite material used to prepare a base as described may be in a range of from $4\times10^{-6}$ m/(m K) to $30\times10^{-6}$ m/(m K), e.g., from $5\times10^{-6}$ m/(m K) to $25\times10^{-6}$ m/(m K).

In certain preferred base structures and electrostatic chuck assemblies, a material of a base may preferably be one that has a coefficient of thermal expansion that matches or is similar to a coefficient of thermal expansion of an adjacent layer of the assembly. Often, as part of an electrostatic chuck assembly, a base layer is located near, adjacent to, or otherwise sufficiently close to a ceramic layer of the assembly such that the base layer and the ceramic layer experience similar temperature conditions, and thermal expansion of one is affected by (e.g., constrained by) the other. If so, a useful combination of a base layer and a ceramic layer of the assembly can be made of materials that have approximately equal coefficients of thermal expansion. A preferred base of an electrostatic chuck assembly may have a coefficient of thermal expansion that is comparable to a coefficient of thermal expansion of a ceramic layer that is part of the same chuck assembly. A coefficient of thermal expansion of the base may be within 25, 20, 15, 10, or 5 percent of the coefficient of thermal expansion (m/(m-degree Kelvin)) of the ceramic layer.

A layer-by-layer approach of an additive manufacturing technique as described can allow for the formation of intricate, precise, and complex shapes that are highly effective structures when included in an electrostatic chuck base. Relative to machining techniques, additive manufacturing techniques as described can be more efficient in producing patterns of cooling channels that are highly intricate, that cover a large portion of a surface area of the base, that take up a large volume of the base structure relative to a total volume of the base structure, or that are structured with a specifically designed (tailored) pattern that allows for cooling of a specific workpiece, having specific features, that is supported by the electrostatic chuck during use.

Channels formed by additive manufacturing techniques may be of a different or a wide range of shapes (in cross-section), patterns (relative to a surface of a base assembly), and sizes (e.g., width or diameter of a channel), and may have surface features that allow for smooth and efficient flow of fluid through the channels. For example, while machining steps typically produce square channels (in cross section), additive manufacturing techniques may be useful to produce round channels (in cross section), which may allow for improved (laminar) flow through the channels as compared to turbulent flow through channels having a square cross-section. As another example, a channel may be formed to exhibit an asymmetric cross-section, which may allow for designs of channels that have improved heat transfer efficiency through a surface of the base.

By an additive manufacturing method, a complete (or substantially complete) functional base layer of an electrostatic chuck can be prepared using a single manufacturing process (a single additive manufacturing "step"), which offers high manufacturing efficiency in a reduced amount of time per unit (high manufacturing throughput). A base layer that is complete with substantially all required structure (including a bottom portion, interior portion, and top portion) may be prepared by a single series of additive manufacturing steps. For example, what can be referred to as a "one-step" additive manufacturing process to form a base structure can form many, most, or all required structures of a base (including a bottom portion, interior portion, and top portion) as a single continuous layer, as a multi-layer composite as described. A one-step additive manufacturing process avoids the need to form multiple separate pieces individually by separate steps, followed by a still additional step of bonding the multiple, separately-formed pieces together to form a functional base structure.

Still further, additive manufacturing techniques can be used to form a base that has highly precision dimensions, including a very precise flatness and a low surface roughness.

According to example methods, a base can be prepared to exhibit a high level of flatness, e.g., an "ultra-flat" surface, and the high level of flatness of the base can improve a level of flatness of an electrostatic chuck assembly, with flatness measured at an upper surface of a metal matrix composite layer of the assembly.

Flatness is a typical property of an electrostatic chuck, or a base component of a chuck, and can be measured by known techniques, such as by using a coordinated measuring machine. In general, a flatness is measured and reported as a difference in height (in a z-direction) between a peak (highest measured point) and a valley (lowest measured point) of a measured surface, and is given in units of distance, e.g., microns. A base having a diameter of 300 millimeter, prepared by only a machining step, may be formed to exhibit a flatness as low as 30 microns. For a surface of a comparable base (300 millimeter diameter) as describe herein, a flatness of a base can be improved relative to a base formed exclusively by machining, by forming the base by an additive manufacturing step, and then further processing a base surface by a machining step. A flatness of a base surface after additive manufacturing may be below 45 or 50 microns, e.g., may be as low as 40 microns. The surface may be further processed by a machining step to provide a still lower flatness, e.g., a flatness of less than 30 microns, e.g., less than 20 microns, or as low as about 15 microns.

For certain advanced applications of electrostatic chuck assemblies (e.g., Cryo, low angle implantation), useful chuck assemblies should exhibit an ultra-high flatness measured at the upper surface of the assembly (e.g., at a top of a ceramic layer. Preferred flatness values for certain applications of chuck assemblies may be below 10 microns, for a 300 millimeter chuck, measured at the upper ceramic surface. It is also important to maintain this ultra-high flatness property over a wide range of operating temperatures. Flatness levels of a chuck assembly over a range of temperatures can be improved by close matching of coefficient of thermal expansion values of different layers of a chuck assembly (a ceramic layer and a base layer), also with improved heat dissipation (heat removal by fluid flow through the base) from the assembly to extract heat, and also with improved flatness of surfaces of these layers at a bond between the layers. Materials used to form a base of a chuck assembly such as titanium, titanium alloys, and metal matrix composites, can result in improved CTE matching and improved flatness relative to previous materials commonly used to form a chuck base, such as aluminum, which is less stiff than these materials.

Additionally, an additive manufacturing method can be used to prepare a base to exhibit a relatively low roughness. Roughness is a typical property of a base of an electrostatic chuck, and can be measured by known analytic techniques, including as represented by an arithmetic average of a roughness profile of a surface (designated "Ra"), e.g., by using a 3D laser microscope or a stylus profilometer. Ra is calculated as the roughness average of a surface's measured microscopic peaks and valleys. Example surfaces of a base prepared by an additive manufacturing method as described, followed by a machining step to reduce roughness of a surface prepared by the additive manufacturing method, can have a surface roughness (Ra) that is less than 1 micron, e.g., less than 0.5 micron, or as low as about 0.1 micron.

Roughness (Ra) can be determined by one of various standards methods, such as by ISO 4287-1:1984 or ASTM F 1048.

Improved precision formation of a base allows for improved, more precise formation of a multi-layer chuck assembly that includes a ceramic layer attached to the base, including improved flatness measured at the top of the ceramic layer. Typical bases prepared by machining methods, having a diameter of 300 millimeter, may be combined with a ceramic layer to form an assembly that exhibits a flatness as low as 30 microns measured at the upper ceramic surface. In example embodiments, a base layer of the present description can be combined with a comparable ceramic layer to form an assembly having a 300 millimeter diameter that exhibits a flatness that is below 30 microns measured at the upper ceramic surface, such as a flatness of less than 25 microns, e.g., less than 20 microns, or as low as about 15 or 10 microns. To achieve this low level of flatness of a metal matrix composite layer of a base assembly, the base layer may be formed by additive manufacturing, and a surface of the base assembly (that will contact the metal matrix composite layer) can be machined to improve the flatness of the surface produced by the additive manufacturing step.

Methods of the present description use an additive manufacturing technique to form a base structure (e.g., a continuous base layer, or a portion of a base layer) by forming multiple layers of a composite, sequentially. The composite is formed from multiple layers that may each, individually, have any useful thickness, and from one or more materials that can be melted to flow and form a dense, inorganic (e.g., metallic or metal matrix composite) solid that is useful as a substantially non-porous material of a base structure.

Generally, a base may be considered to have a form of flat and thin, typically circular structure (viewed from a top and a bottom direction) such as a flat disk that includes two opposed flat and circular surfaces with a thickness therebetween. The two opposed surfaces operate as a top and a bottom of a base layer. An interior portion of a base is present between the two opposed surfaces. The interior portion can include a system of enclosed channels (cooling channels) that extend through the interior portion with a winding, meandering, twisting, circuitous, or serpentine path.

The channels are capable of containing a flow of fluid (e.g., water or another liquid or gaseous cooling fluid) that can be used to control a temperature of the base during operation of the base. Other structures may also be formed into surfaces of the base, such as vertical openings ("apertures") that extend between the thickness and between the two opposed surfaces of the base (from the top to the bottom and over the entire thickness), or channels or grooves at one or both of the top surface and the bottom surface.

A functional base layer of a chuck assembly can be considered to include at least three different portions: a lower portion that includes a bottom surface; an upper portion that includes an upper surface that is opposite of the bottom surface; and a middle ("interior") portion that is disposed between the upper portion and the lower portion and that may contain a cooling channel. Preferably, according to preferred methods as described, all three portions, and all layers thereof, can be produced by an additive manufacturing method by which a single (preferably un-interrupted) series of layer-forming steps is used, optionally and preferably with all layer-forming steps being performed on a single additive manufacturing apparatus, to form all layers of a functional base layer as a continuous, seamless layer of inorganic material that does not include any seam or internal boundary such as a scam or boundary that may be formed by a bonding step (e.g., vacuum brazing). "Un-interrupted" means that each layer-forming step in a series of additive manufacturing steps is performed in sequence without any different type of step (e.g., any type of non-layer-forming step) being performed between any two of the layer-forming steps, and without a bonding step (different from an additive manufacturing step) that bonds two pieces of the base layer together using a filler material, brazing material, adhesive material, or the like.

Such a method, as an example of the presently described methods, may include: forming a lower portion of a base that includes a bottom surface, by additive manufacturing; forming a middle portion of the base that includes cooling channels, over the lower portion, by additive manufacturing; and forming an upper portion of the base that includes an upper surface, over the middle portion, by additive manufacturing.

Each layer of a composite may be formed as desired, from a desired material, and with a desired thickness, to produce a base structure in the form of a multi-layer composite that has desired properties. By exemplary additive manufacturing methods, each layer is prepared from a collection of particles (referred to as "feedstock") that is generally in the form of a powder. A feedstock contains small particles made of one or a variety of different inorganic materials that can be melted by a high energy laser to liquefy and flow to form a continuous layer of the melted material, then cool to solidify to form a layer of a multi-layer composite.

Particles that are useful according to the present description may be any particles that can be processed to form a useful multi-layer composite as described. Particles may be included in a feedstock in the form of a powder that comprises, consists of, or consists essentially of inorganic particles that can be melted using energy from a high-energy laser to form a layer of a multi-layer composite.

Examples of useful particles include inorganic particles that are capable of being melted or liquefied by laser energy to form a layer of a base structure as described. Examples of such particles include inorganic particles that are made of metals (including alloys) and metal matrix composites. Some useful examples, generally, including metals and metal alloys such as aluminum, titanium, and their alloys, as well as metal matrix composites. One specific example of a useful aluminum alloy is AlSiMg. One specific example of a useful titanium alloy is $Ti_6Al_4V$.

Useful particles of a feedstock can be of any size (e.g., mean particle size) or size range that is effective, including small or relatively small particles on a scale of microns (e.g., having an average size of less than 500 microns, less than 100 microns, less than 50 microns, 10 microns, or less than 5 microns).

The particles can be selected to achieve effectiveness in processing as described, to be capable of being contained in a feedstock, formed into a feedstock layer, and melted to flow to form a continuous layer that can cool to form solidified feedstock as a layer of a multi-layer composite. The size, shape, and chemical makeup of the particles can be any that are effective for these purposes.

The particles can be in the form of a feedstock composition that can be used in an additive manufacturing process of the present description. According to examples, feedstock useful in an additive manufacturing process may contain particles that are capable of being melted to form a continuous, substantially non-porous layer of a multi-layer composite. The feedstock material is not required to contain any other material, but may if desired optionally contain small amounts of other materials. Example feedstock compositions may contain at least 80, 90, or 95, 98, or 99 percent inorganic particles by weight, based on total weigh of a feedstock composition. Other ingredients may be present if desired, at low amounts, such as one or more of a flow aid, surfactant, lubricant, leveling agent, or the like.

Each layer of a multi-layer composite may be formed to have any useful thickness. A thickness of a layer of a multi-layer composite is measured of a layer of the composite after the layer has been formed by melting particles of a feedstock layer to form a continuous, melted, and then solidified layer of the composite. Example thicknesses of a layer of a composite may be in a range from 30 microns to 100, 200, or more microns, e.g., from 30 to 50, 60, 70, 80, microns up to 90, 100, 150, 200, 300, 400, or 500 microns. In example composite structures, all layers of the composite may have the same thickness or substantially the same thickness. In other example composite structures, the layers may not all have the same thickness, but different layers of the composite may each have different thicknesses.

According to certain example methods and base structures of the present description, a base may be prepared by additive manufacturing steps by forming layers of a composite to have different thicknesses at different portions of the base. Examples of these methods and structures involve forming one or more layers that have lower thicknesses (referred to as "fine layers"), e.g., at top and bottom portions of the base, and forming layers having greater thicknesses ("coarse layers"), e.g., at an inner portion of the base between the top portion and the bottom portion.

The positions of one or more fine layers as part of a multi-layer composite (e.g., in the form of a base layer), relative to coarse layers, may be any useful positions. Various locations of coarse layers and fine layers of a composite, and various orders of forming coarse layers relative to fine layers, may be effective. However, according to specific embodiments of base structures and related methods as described, one or more fine layers may preferably be present at one or more surfaces of a base, while coarse layers may be present at an interior portion of the same base. The fine layers may desirably be located at the one or more surfaces because fine layers may exhibit more desirable physical properties relative to coarse layers (see below). Layers of an interior portion of a base, of which higher quality is less important, may be prepared from coarse layers to increase manufacturing efficiency (see below).

Forming layers of a base to have different thicknesses can produce advantages with respect to processing efficiency, and also with respect to physical properties of a base (or portions of a base). Forming one or more "coarse" layers of greater thicknesses will have a beneficial effect of increasing a rate of production, and efficiency, of a base. Thicker coarse layers may have reduced quality (see below) relative to thinner (fine) layers, but forming layers of relatively greater thickness will increase a rate of production (reduce the amount of time needed) of a base; the increased thicknesses of thicker (coarse) layers will reduce the total number of layers that must be formed, and the number of layer-forming steps needed, to produce a base having a particular thickness. A thickness of a coarse layer may be a thickness that is within a typical range of layers formed by an additive manufacturing method, e.g., a thickness in a range of from 70, 80, 90, or 100 microns up to 500 microns. A greater thickness of a coarse layer will reduce a number of steps and an amount of time required to form a finished multi-layer composite of a pre-determined total thickness.

Thickness of a layer formed by an additive manufacturing technique may affect physical properties (quality) of the layer when the layer-forming step uses identical feedstock and an identical laser. For example, a thinner layer may form to contain fewer internal open spaces, or "pores," as compared to a thicker layer formed using identical feedstock and an identical laser. The presence of pores in a layer may be measured and expressed in terms of apparent density of a layer. In general, when using an additive manufacturing process that applies the same laser and the same laser power to a feedstock layer, for the same amount of time, an apparent density of a thicker (coarse) layer will be lower than an apparent density of a similar (e.g., fine) layer that has a lower thickness but is prepared from the same feedstock.

Apparent density refers to a measured density of a layer of a composite relative to an actual (or theoretical) density of the material used to form the layer in a one-hundred percent solid, non-porous (zero porosity), form. A layer of a composite will typically be a continuous solid material, because of being formed by a step that melts particles of a feedstock and allows the melted particles to flow and form a continuous layer (e.g., "film") from the material of the liquefied particles. Typically, however, the continuous solid material that is formed is not one-hundred percent solid but contains a small amount of void space or pores that are not removed during the layer-formation process. The pores can cause reduced performance in the base by potentially allowing a cooling fluid (water) to leak from cooling channels, through porous material of the base, to the exterior of the base, particularly if the base is used in a process under vacuum.

Oftentimes, pores in a layer or a composite may be visible optically, with or without magnification, at a surface or at an interior portion of a composite. Alternately, these void spaces can be detected as a reduced density (apparent density) of a layer of a composite or a portion of a composite. A layer formed with no void spaces (100 percent solid inorganic material with zero percent pores) will have a density that is equal to the density of the inorganic material, without pores, used to prepare the layer. A mass of inorganic material that includes pores will have a density (apparent density) that is slightly lower than the density of the inorganic material.

A density of a layer (an apparent density, when including volume of pores in the layer) is a measure of the mass of the layer divided by the volume (including pore volume) of the layer, divided by the actual (theoretical) density value of the material used to form the layer with zero pore volume, and is reported as a percentage of the actual density. An apparent density value of a layer or a portion of a composite (or a base layer) as described may typically be relatively high, e.g., greater than 80, 90, 92, 96, 98, or 99 percent of the actual density of a material used to form the layer.

When forming a layer of a composite from inorganic particles, energy from a high-powered laser is used to melt the inorganic particles formed as a feedstock layer. The melted particles flow to form a continuous layer (e.g., a "film") that solidifies as a layer of the composite. Ideally (theoretically), the laser energy will completely melt all particles of a feedstock composition used to prepare the layer, and the flow of the liquefied particle material will form a void-free liquid layer that solidifies to form a void-free solid. In practice, however, layers that are formed this way may commonly include imperfections, voids, or partially non-melted particles, with the amount of these imperfections being greater for layers formed to have a greater thickness (for identical feedstock, using an identical laser, and an equal time of exposing the laser to an area of a feedstock layer).

A step of forming a coarse layer of a composite will include forming a feedstock layer having a higher thickness, and melting the particles of the feedstock. Using an equal amount of laser power for a coarse layer (having more particles) as may be used for melting particles of a fine layer (having fewer particles), and equal time of exposing the laser to an area of the feedstock, the amount of laser power available to melt the number of particles of the thicker feedstock layer (having a higher number of particle) is lower, per particle. Lower received laser energy per particle of a feedstock layer (which is a higher number of particles for a coarse feedstock layer) can cause a coarse layer to have a higher level of imperfections compared to a fine layer.

A higher amount of imperfections can correlate to a lower apparent density. An apparent density of a coarse layer will typically be lower than an apparent density of a fine layer, when using identical feedstock, an identical laser, and identical time of exposure of a laser to an area of a feedstock layer. In example methods and base structures, an apparent density of any layer of a base may preferably be at least 98 or 99 percent. More particularly, an apparent density of a coarse layer of a base may preferably be at least 99.0 percent, e.g., at least 99.2 or 99.4 percent. An apparent density of a fine layer of a base may preferably be greater than an apparent density of a coarse layer of the same base, and may be at least 99.4 percent, e.g., at least 99.6 percent.

Forming or more "fine" layers having reduced layer thicknesses can be useful to improve physical qualities of a base structure. Finer layers of a composite made by additive manufacturing methods have been found to exhibit useful or preferred physical properties such as higher density and a relatively lower amount of imperfections such as pores formed in the layer.

On the other hand, forming multiple fine layers having lower thicknesses during an additive manufacturing process will reduce the rate of production of a multi-layer composite, i.e., will increase the number of steps and the amount of time required to produce a multi-layer composite that has a particular thickness, because a higher number of the fine (thinner) layers must be formed, meaning that a higher number of additive manufacturing steps is required to build a multi-layer composite of a given thickness.

A thickness of a fine layer can be a thickness that is within a typical a range of thicknesses of layers formed by an additive manufacturing method, especially at a low end of the range, such as a thickness in a range from 30 microns to 100 microns, e.g., from 30 to 50, 60, 70, 80, or 90 microns.

A base as described can be prepared by additive manufacturing methods that form dense metal or metal matrix composite multi-layer composite structures using a series of individual layer-forming steps. As one example, the technique referred to as selective laser melting (SLM) is a version of additive manufacturing technology that can be used to form a multi-layer composite in a layer-by-layer fashion. Selective laser melting uses high-power laser energy to selectively cause metal or metal matrix composite particles of a feedstock layer to melt, flow, and form a substantially continuous solidified feedstock layer.

More specifically, a multi-layer composite may be built by sequential steps of producing many thin cross sections ("solidified feedstock" of a "layer," herein) of a larger three-dimensional structure (composite). A layer of feedstock is formed, and includes many particles of metal or metal matrix composite. Laser energy is selectively applied to the feedstock layer over a portion of a layer of the feedstock. The portion of a feedstock layer that receives laser energy is a portion that will be the non-channel portion of a layer of the multi-layer composite base; portions of the feedstock layer that do not receive laser energy will be channels in the multi-layer composite base.

The laser energy melts particles at the portion of the feedstock that are exposed to the laser energy. The melted particles liquefy and flow into a continuous layer of the material of the melted particles and then cool to solidify as a layer of solidified feedstock. After an initial layer of solidified feedstock is formed, an additional thin layer of the feedstock is deposited over the top surface of the completed layer that contains the solidified feedstock. The process is repeated to form multiple layers of the solidified feedstock, each layer being formed on top of and adhering to a top surface of a previous layer. Multiple layers are deposited, successively, one over each completed layer, to form a multi-layer composite that is a composite of each layer of solidified feedstock. The multiple layers may be of the same composition and thickness, or may be of different compositions and different layer thicknesses.

An example of a selective laser melting additive manufacturing technique (200) useful for preparing a multi-layer composite as described, is shown at FIG. 7. The process can be performed using commercially available selective laser melting additive manufacturing equipment and particles to form feedstock. Feedstock 202 is a powder that contains a collection of inorganic particles. According to example steps as shown at FIG. 7, powder feedstock (202) contained by a selective laser melting additive manufacturing apparatus is formed as an even layer over a build plate of the apparatus (204, 206). In a subsequent step (208), a source of electromagnetic radiation (e.g., a high powered laser) selectively irradiates a portion of this first layer of feedstock with radiation of a wavelength and energy that will melt the particles. The melted particles flow into a continuous film and then solidify by cooling. The layer of feedstock may be a fine layer or a coarse layer, and may have any useful thickness. The solidified material of the melted particles forms solidified feedstock at the irradiated portion. Portions of the feedstock layer that are not formed to solidified feedstock remain as the original liquid feedstock.

The build plate is moved down (210) and a second layer (either a fine layer or a coarse layer) of the powder feedstock is formed (212) as a second even layer over the first feedstock layer and over the solidified feedstock of the first feedstock layer. The source of electromagnetic radiation then selectively irradiates a portion of the second layer (214), which causes particles at the portion to melt. The melted portions then cool to form solidified feedstock at the portions of the second layer. Portions of the second layer that are not formed to solidified feedstock remain as the original powder feedstock. Steps 212, 214, and 216 are repeated (218) to form a completed multi-layer solidified feedstock composite surrounded by the original liquid feedstock (202).

The multi-layer solidified feedstock composite is a body that contains the solidified feedstock of each formed layer, and is composed of multiple continuous layers made from the material of the melted particles of the feedstock. The original feedstock (202) can be removed and separated from the multi-layer composite (218).

Figure 9:
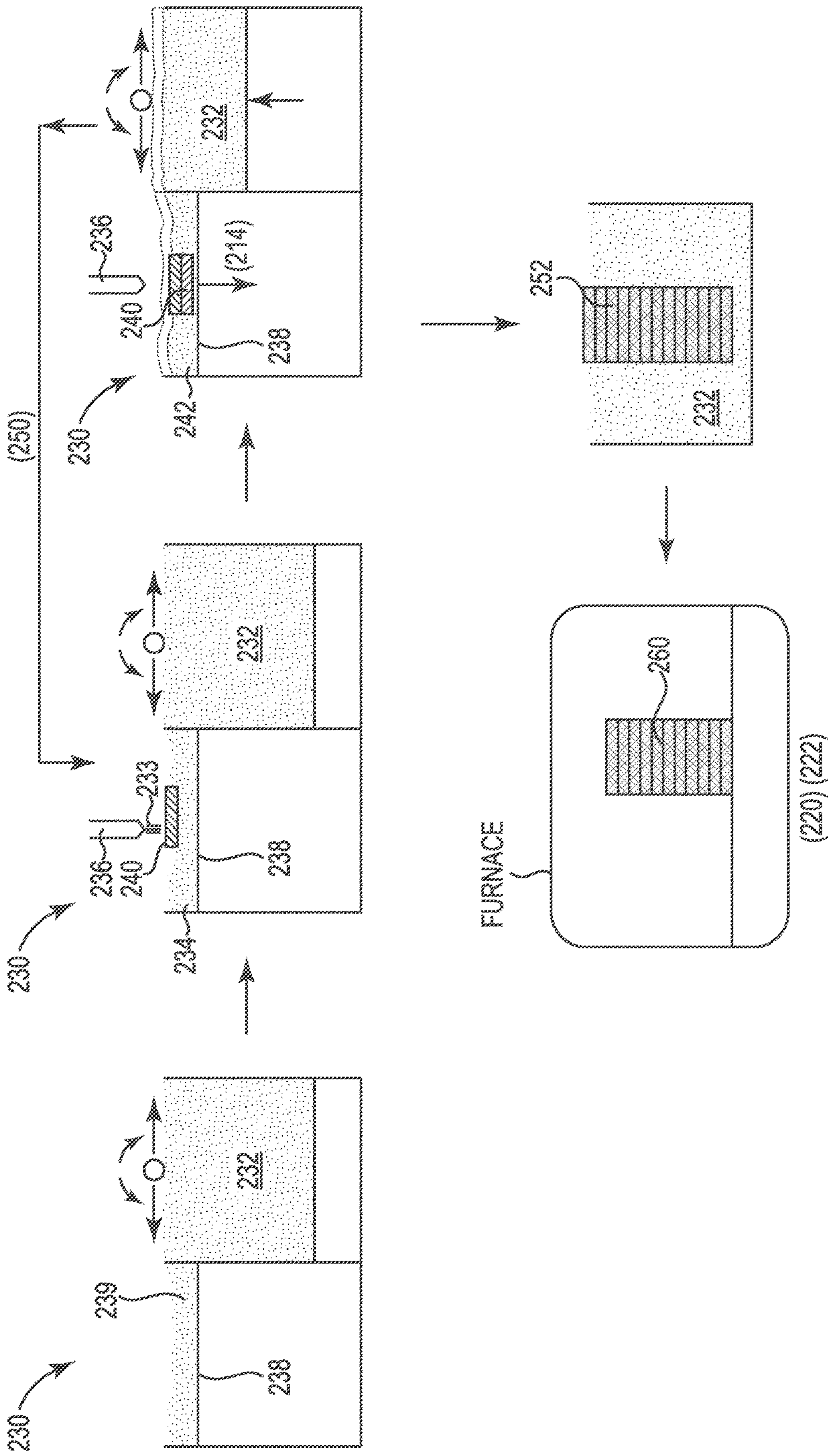
FIG. 9 shows steps of an example method as described.

Referring to FIG. 9, an example process can be performed using commercially available selective laser melting additive manufacturing apparatus (230), and using powder feedstock (232) according to the present description. According to example steps of the method, feedstock (232) is formed as an even feedstock layer (234) over a build plate (238) of the apparatus (230). Laser (236) applies electromagnetic radiation (233) to a portion of the first layer (234), which causes particles of feedstock to melt and flow to a continuous layer, which is then allowed to cool to form first solidified feedstock (240) at the portion. Portions of feedstock layer (234) that are not formed to solidified feedstock (240) remain as the original feedstock (232). The build plate (238) is moved down (214) and a second or subsequent feedstock layer (242) is formed over the first layer (234) and the first solidified feedstock (240). The laser (236) then selectively applies electromagnetic radiation (233) to portions of the second layer (242), causing particles of the feedstock to melt and flow to form a continuous layer, which is allowed to cool and form solidified feedstock from the second layer. Portions of the second layer that are not formed to solidified feedstock remain as the original powder feedstock. The sequence is repeated (250) to form a completed multi-layer solidified feedstock composite (252) surrounded by the original feedstock (232). The multi-layer solidified feedstock composite (252) is a body that contains the solidified feedstock of each formed layer, and is composed of the material of the melted particles of the feedstock. The original feedstock (232) can be removed and separated from the multi-layer composite (252).

In a first aspect, the disclosure provides an electrostatic chuck base comprising: an upper base surface; a lower base surface; an interior portion between the upper base surface and the lower base surface; and a channel within the interior portion, the channel comprising: an inlet at a surface of the chuck base; an outlet at a surface of the chuck base; a length between the inlet and the outlet; and a cross section along the length that comprises: a varied cross-sectional area along the length; a varied cross-sectional shape along the length; or a varied distance from the upper surface along the length.

A second aspect according to the first aspect, wherein the channel comprises a varied distance from the upper surface along the length.

A third aspect according to the first or second aspect, wherein the channel comprises a varied cross-sectional area along the length.

A fourth aspect according to the first or second aspect, wherein the channel comprises a varied cross-sectional shape along the length.

A fifth aspect according to any of the preceding aspects, wherein: the inlet passes through the lower surface, and a portion of the length that has a smaller cross-sectional area is closer to the upper surface, compared to a portion of the length that has a larger cross-sectional area.

A sixth aspect according to the first aspect, further comprising two non-connected, intersecting channel portions that pass at one location between the upper base surface and the lower base surface.

A seventh aspect according to the first aspect, further comprising a channel portion that exhibits a tapering cross sectional area.

An eighth aspect according to the first aspect, the channel comprising: an edge portion that is adjacent to an edge at a perimeter of the base, and an inner portion that is between the edge portion and a center of the base, wherein the edge portion is closer to the upper surface compared to the inner portion.

A ninth aspect according to the first aspect, wherein the channel comprises a portion that splits from a single channel to form two channel portions.

A tenth aspect according to the first aspect, wherein the inlet connects to a channel that extends in two directions from the inlet, and the outlet connects to a channel that extends in two directions from the outlet.

An eleventh aspect according to the first aspect, wherein the channel comprises a first channel portion, a second channel portion, and a connector channel that connects the first channel portion to the second channel portion and allows fluid to flow from the first channel portion into the second channel portion.

A twelfth aspect according to any of the preceding aspects further comprising a multi-layer composite that extends from the upper base surface to the lower base surface.

A thirteenth aspect according to the twelfth aspect, wherein the composite does not contain a metallic seam.

A fourteenth aspect according to the thirteenth aspect, wherein the multi-layer composite comprises aluminum alloy.

A fifteenth aspect according to the fourteenth aspect, wherein the aluminum alloy is AlSiMg.

A sixteenth aspect according to the thirteenth aspect, wherein the multi-layer composite comprises titanium alloy.

A seventeenth aspect according to the sixteenth aspect, wherein the titanium alloy is $Ti_6Al_4V$.

An eighteenth aspect discloses a method of making an electrostatic chuck base of any of the preceding aspects by additive manufacturing, the method comprising: forming a first feedstock layer on a surface, the feedstock layer comprising inorganic particles; forming solidified feedstock from the first feedstock layer; forming a second feedstock layer over the first feedstock layer, the second feedstock layer comprising inorganic particles; and forming second solidified feedstock from second feedstock layer, wherein the solidified feedstock layer and second feedstock layer are part of a multilayer composite electrostatic chuck base.

A nineteenth aspect according to the eighteenth aspect, further comprising forming the solidified feedstock by melting inorganic particles using a laser.

A twentieth aspect discloses a method of forming an electrostatic chuck base of any of the first through seventeenth aspects by additive manufacturing, the method comprising: forming a lower base portion that includes the bottom surface, by additive manufacturing; forming a middle base portion that includes a channel, over the lower base portion, by additive manufacturing; and forming an upper base portion that includes the upper surface, over the middle base portion, by additive manufacturing.

A twenty-first aspect according to the twentieth aspect, further comprising: forming the lower base portion by additive manufacturing steps that include forming a fine layer having a fine layer thickness, forming the middle base portion by additive manufacturing steps that include forming multiple coarse layers, each coarse layer having a coarse layer thickness that is greater than the fine layer thickness, and forming the upper base portion by additive manufacturing steps that include forming a fine layer having a fine layer thickness.

The invention claimed is:

1. An electrostatic chuck base comprising:

an upper base surface;

a lower base surface;

an interior portion between the upper base surface and the lower base surface; and a channel within the interior portion, the channel comprising:

an inlet at a surface of the chuck base;

an outlet at a surface of the chuck base;

a length between the inlet and the outlet;

and a cross section along the length that comprises
a varied cross-sectional area along the length,
a varied cross-sectional shape along the length, or
a varied distance from the upper surface along the length, wherein the channel defines a first, closed loop flow path from the inlet to the outlet covering a first half of the electrostatic chuck base and a second, closed loop flow path from the inlet to the outlet covering a second half of the electrostatic chuck base.

2. The electrostatic chuck base of claim 1, the channel comprising a varied distance from the upper surface along the length.

3. The electrostatic chuck base of claim 1, the channel comprising a varied cross-sectional area along the length.

4. The electrostatic chuck base of claim 1, the channel comprising a varied cross-sectional shape along the length.

5. The electrostatic chuck base of claim 1, wherein:
the inlet passes through the lower surface, and
a portion of the length that has a smaller cross-sectional area is closer to the upper surface, compared to a portion of the length that has a larger cross-sectional area.

6. The electrostatic chuck base of claim 1, further comprising two non-connected, intersecting channel portions that pass at one location between the upper base surface and the lower base surface.

7. The electrostatic chuck base of claim 1, further comprising a channel portion that exhibits a tapering cross sectional area.

8. The electrostatic chuck base of claim 1, the channel comprising:
an edge portion that is adjacent to an edge at a perimeter of the base, and
an inner portion that is between the edge portion and a center of the base, wherein the edge portion is closer to the upper surface compared to the inner portion.

9. The electrostatic chuck base of claim 1, the channel comprising a first channel portion, a second channel portion, and a connector channel that connects the first channel portion to the second channel portion and allows fluid to flow from the first channel portion into the second channel portion.

10. The electrostatic chuck base of claim 1, further comprising a multi-layer composite that extends from the upper base surface to the lower base surface.

11. The electrostatic chuck base of claim 10, wherein the composite does not contain a metallic seam.

12. The electrostatic chuck base of claim 11, wherein the multi-layer composite comprises aluminum alloy.

13. The electrostatic chuck base of claim 12, wherein the aluminum alloy is AlSiMg.

14. The electrostatic chuck base of claim 11, wherein the multi-layer composite comprises titanium alloy.

15. The electrostatic chuck base of claim 14, wherein the titanium alloy is Ti6Al4V.

16. A method of making an electrostatic chuck base of claim 1 by additive manufacturing, the method comprising:
forming a first feedstock layer on a surface, the feedstock layer comprising inorganic particles;
forming solidified feedstock from the first feedstock layer;
forming a second feedstock layer over the first feedstock layer, the second feedstock layer comprising inorganic particles; and
forming second solidified feedstock from second feedstock layer, wherein the solidified feedstock layer and second feedstock layer are part of a multilayer composite electrostatic chuck base.

17. The method of claim 16, further comprising forming the solidified feedstock by melting inorganic particles using a laser.

18. A method of forming an electrostatic chuck base of claim 1 by additive manufacturing, the method comprising:
forming a lower base portion that includes the bottom surface, by additive manufacturing;
forming a middle base portion that includes a channel, over the lower base portion, by additive manufacturing; and
forming an upper base portion that includes the upper surface, over the middle base portion, by additive manufacturing.

19. The method of claim 18, further comprising:
forming the lower base portion by additive manufacturing steps that include forming a fine layer having a fine layer thickness,
forming the middle base portion by additive manufacturing steps that include forming multiple coarse layers, each coarse layer having a coarse layer thickness that is greater than the fine layer thickness, and
forming the upper base portion by additive manufacturing steps that include forming a fine layer having a fine layer thickness.

* * * * *